United States Patent [19]
Libove et al.

[11] Patent Number: 5,473,244
[45] Date of Patent: Dec. 5, 1995

[54] APPARATUS FOR MEASURING VOLTAGES AND CURRENTS USING NON-CONTACTING SENSORS

[76] Inventors: Joel M. Libove, 475 Yampa Way, Fremont, Calif. 94539; Jerome R. Singer, 2917 Avalon Ave., Berkeley, Calif. 94705

[21] Appl. No.: 177,709

[22] Filed: Jan. 5, 1994

Related U.S. Application Data

[63] Continuation of Ser. No. 946,979, Sep. 17, 1992, abandoned.

[51] Int. Cl.$^6$ .............................. G01R 15/06; G01R 1/30
[52] U.S. Cl. .............................................. 324/126; 324/130
[58] Field of Search ................................ 324/117 R, 126, 324/127, 687, 688, 548, 130, 122, 123 C, 74, 123 R; 336/175; 364/571.01

[56] References Cited

U.S. PATENT DOCUMENTS

| | | | |
|---|---|---|---|
| 3,477,024 | 11/1969 | Pelta | 324/126 |
| 3,657,650 | 4/1972 | Arndt | 324/127 |
| 3,706,032 | 12/1972 | Vikstrom | 324/127 |
| 4,005,380 | 1/1977 | Heilmann et al. | 324/127 |
| 4,325,022 | 4/1982 | Pelletier | 324/127 |
| 4,611,207 | 9/1986 | Anderson et al. | 324/126 |
| 4,714,893 | 12/1987 | Smith-Vaniz | 324/126 |
| 4,794,327 | 12/1988 | Fernandes | 324/142 |
| 5,017,859 | 5/1991 | Engel et al. | 324/127 |
| 5,097,202 | 3/1992 | Gamble | 324/127 |

OTHER PUBLICATIONS

"Non Contact Voltmeter Increases Safety and Speed"; Design News Mar. 6, 1995; pp. 114–115.

*Primary Examiner*—Vinh P. Nguyen
*Attorney, Agent, or Firm*—Flehr, Hohbach, Test, Albritton & Herbert

[57] ABSTRACT

An apparatus for performing non-contacting measurements of the voltage, current and power levels of conductive elements such as wires, cables and the like includes an arrangement of capacitive sensors for generating a first current in response to variation in voltage of a conductive element. Each sensor is positioned in an electric field of the conductive element, and is thereby coupled to the conductive element through a coupling capacitance. A reference source drives the capacitive sensor arrangement at a reference frequency so as to induce the flow of a reference current therethrough. A measurement network is disposed to calculate the coupling capacitance based on a measurement of the reference current, and to then determine the voltage in the conductive element based on the first current and the coupling capacitance. Measurements of a composite current through single or multiple-element conductors may be effected using a similar procedure, wherein the composite current induces a measurement current to flow within a set of coils positioned in a predetermined manner proximate the conductor. In both current and voltage measurements a balancing procedure may be employed, in which a measurement signal is balanced by a feedback signal so as to improve accuracy and reduce the effects of stray coupling.

8 Claims, 16 Drawing Sheets

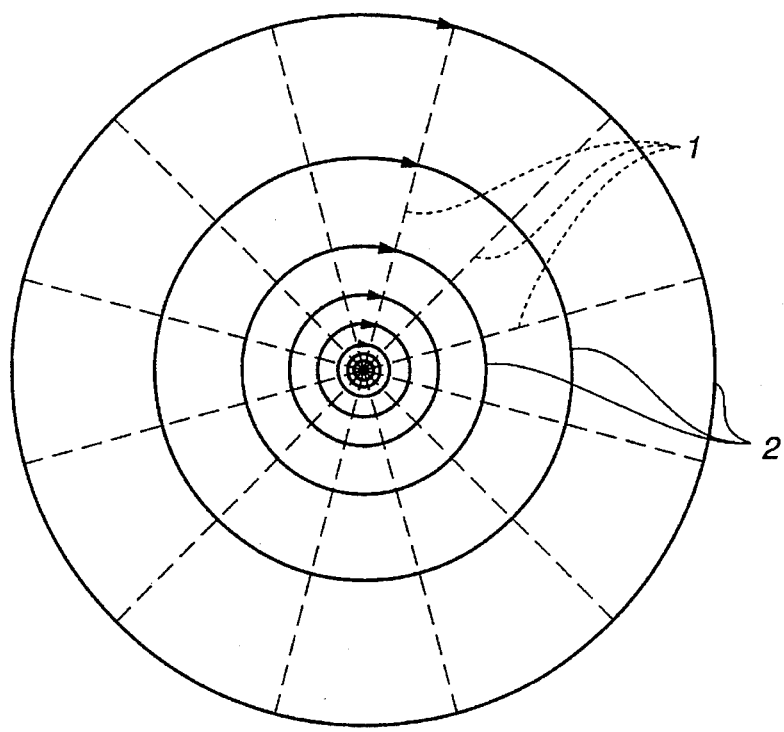
FIG._1A
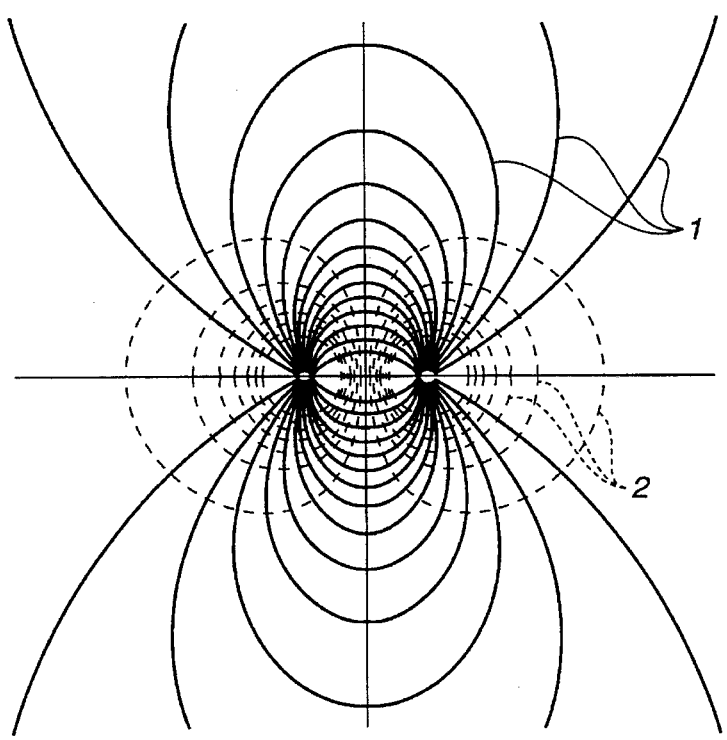
FIG._1B

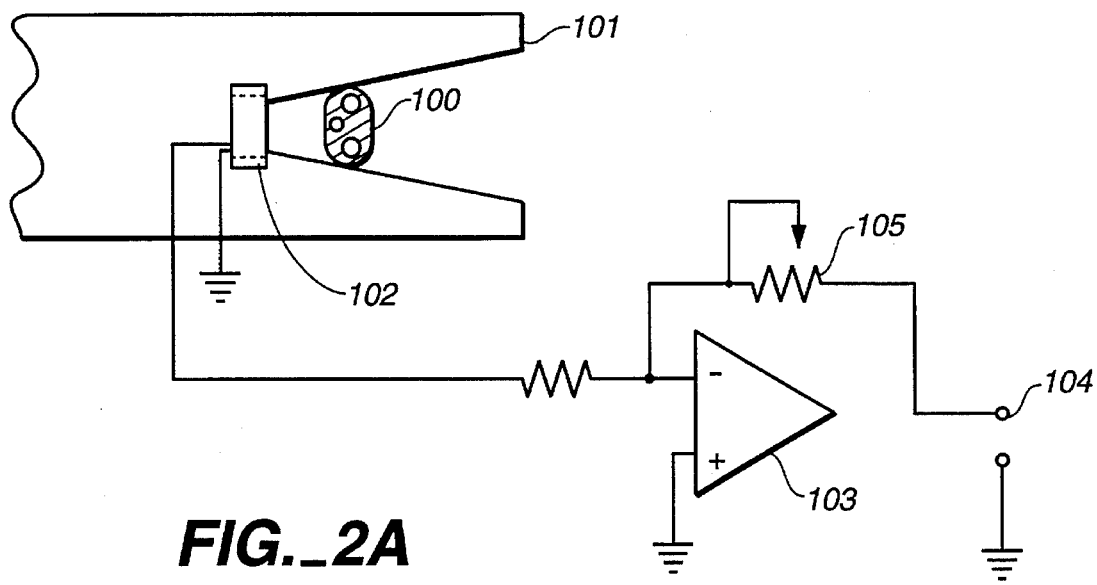
FIG._2A
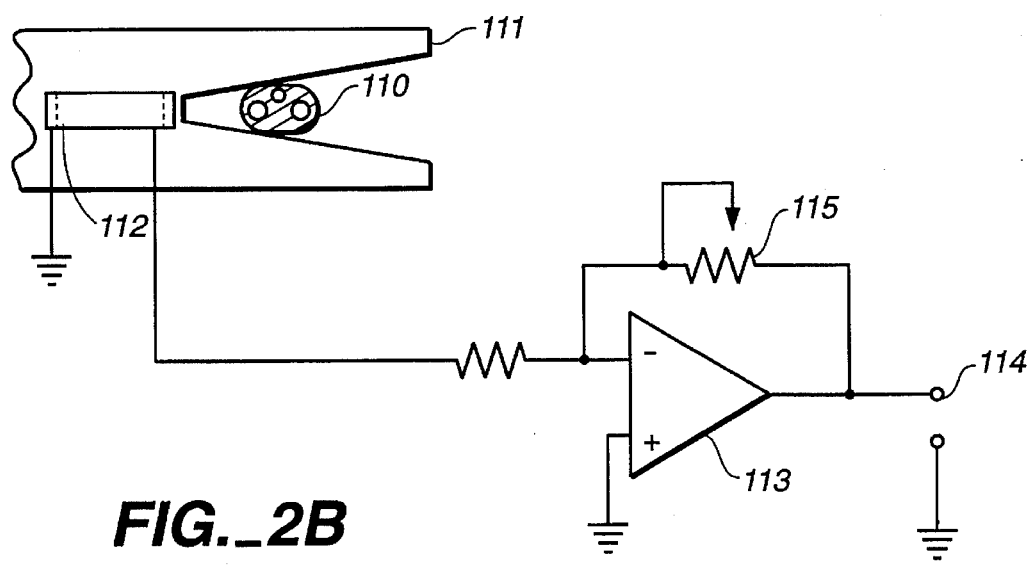
FIG._2B

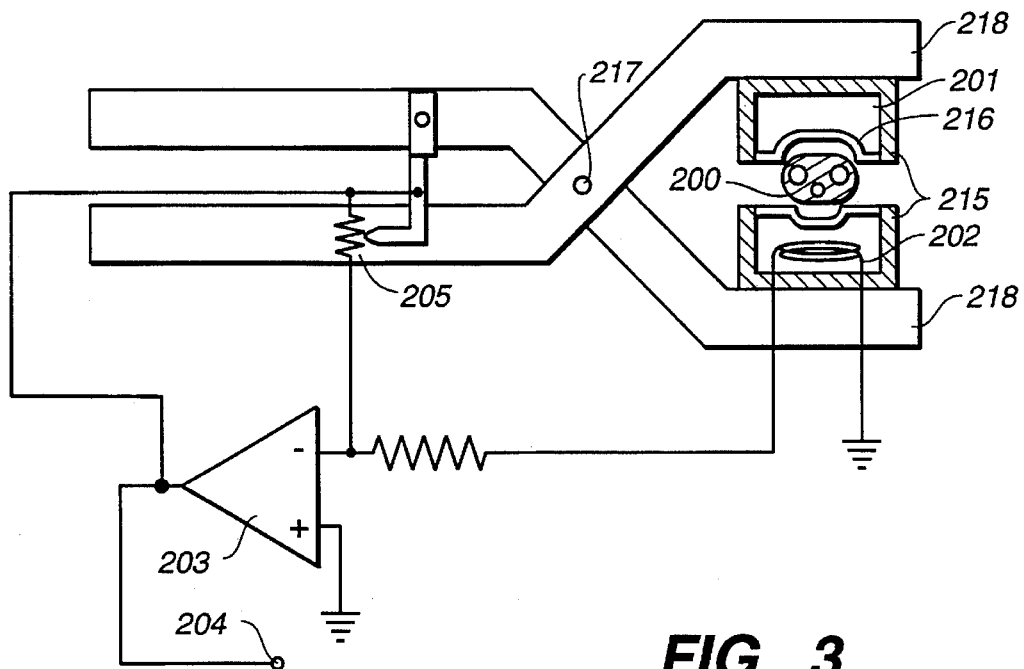
FIG._3
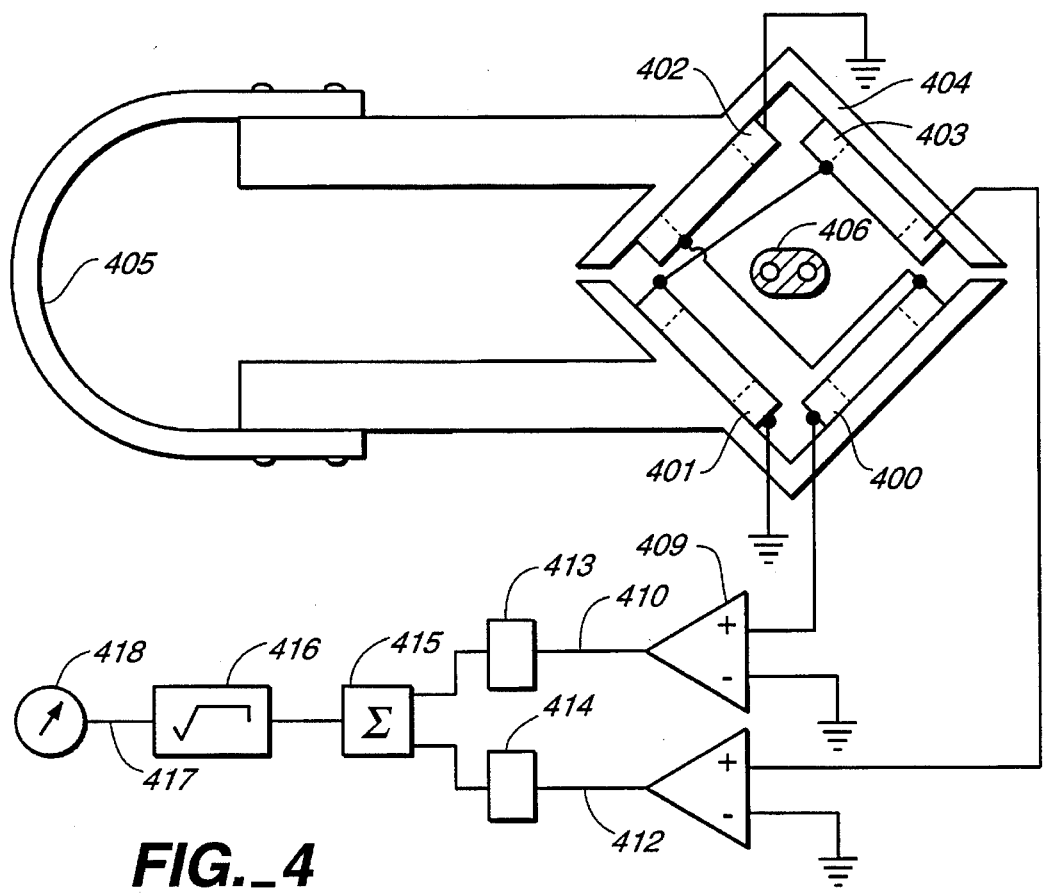
FIG._4

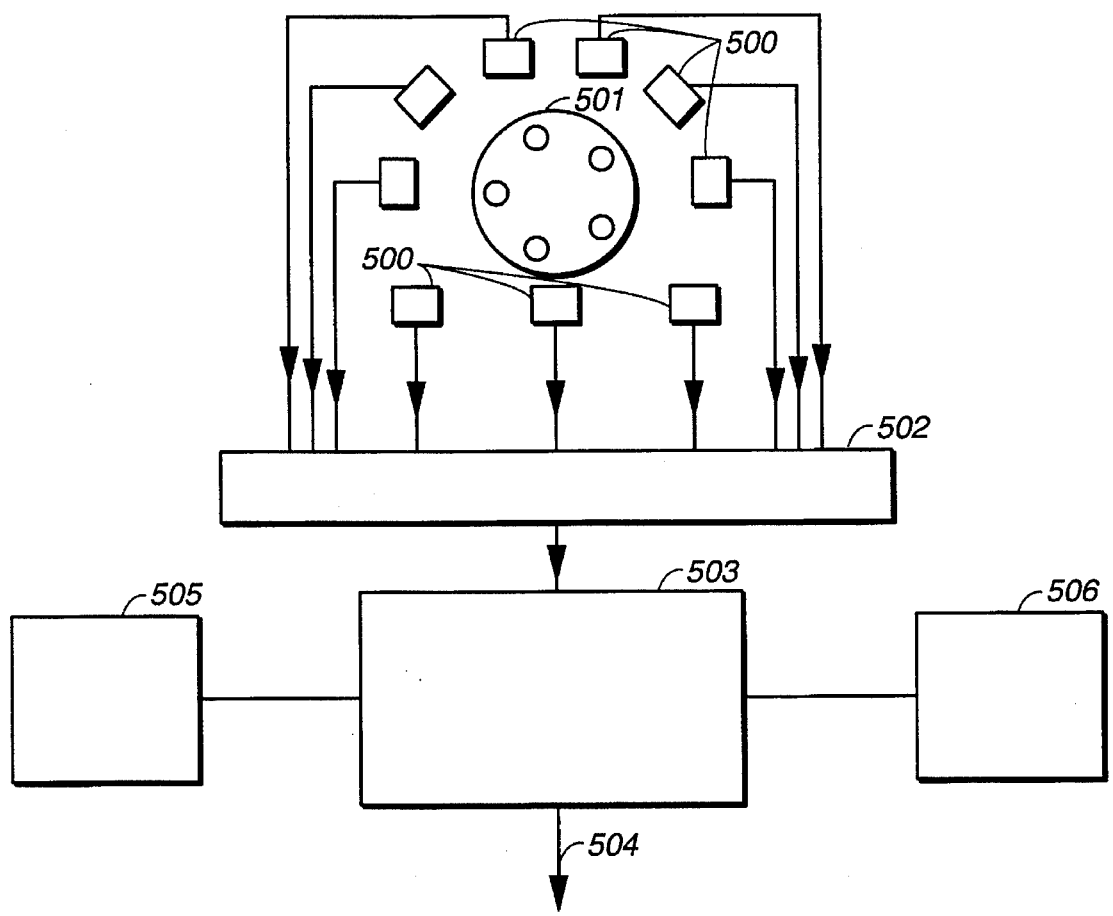
FIG. 5A
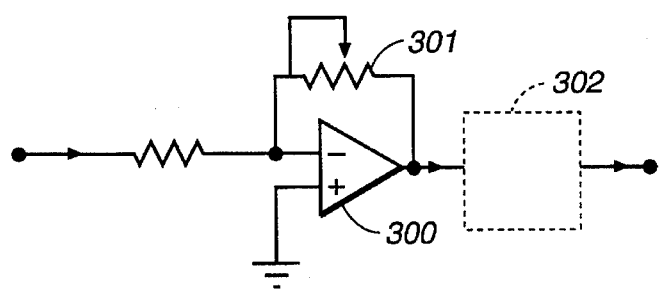
FIG._6

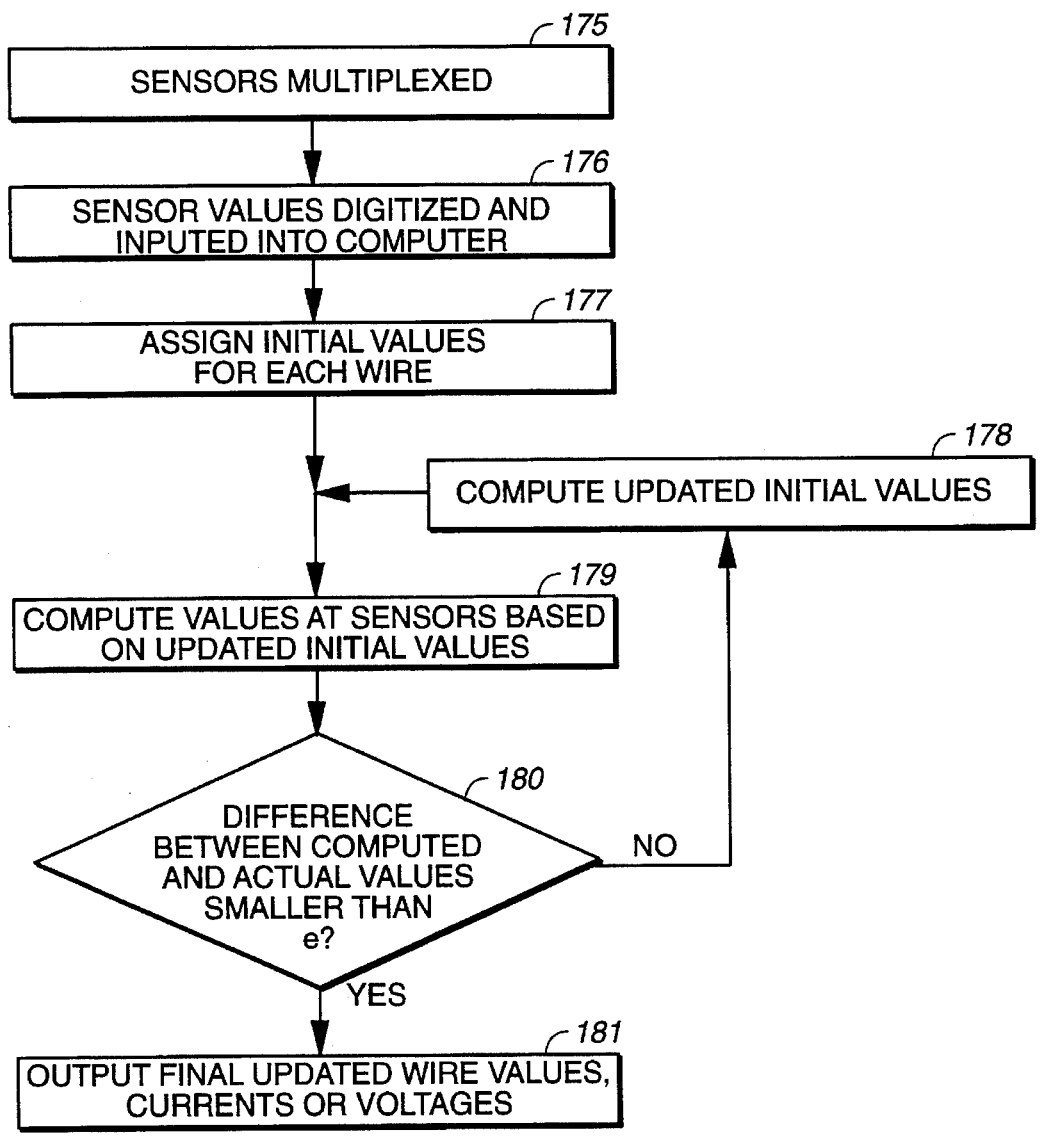
FIG._5B
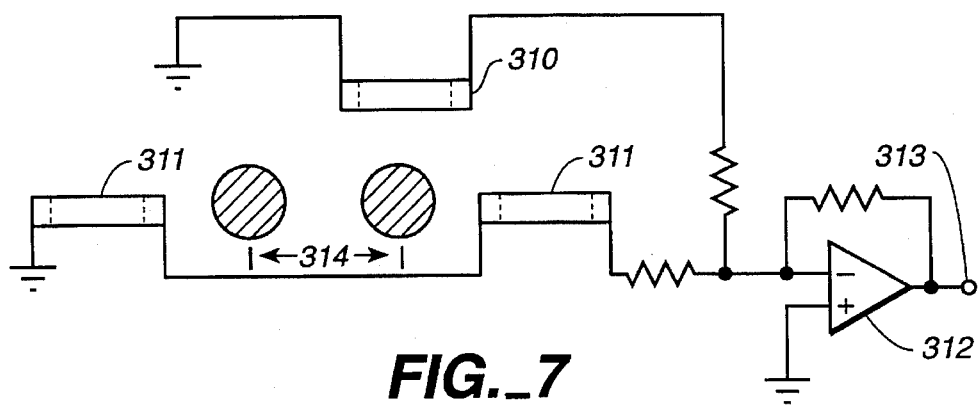
FIG._7

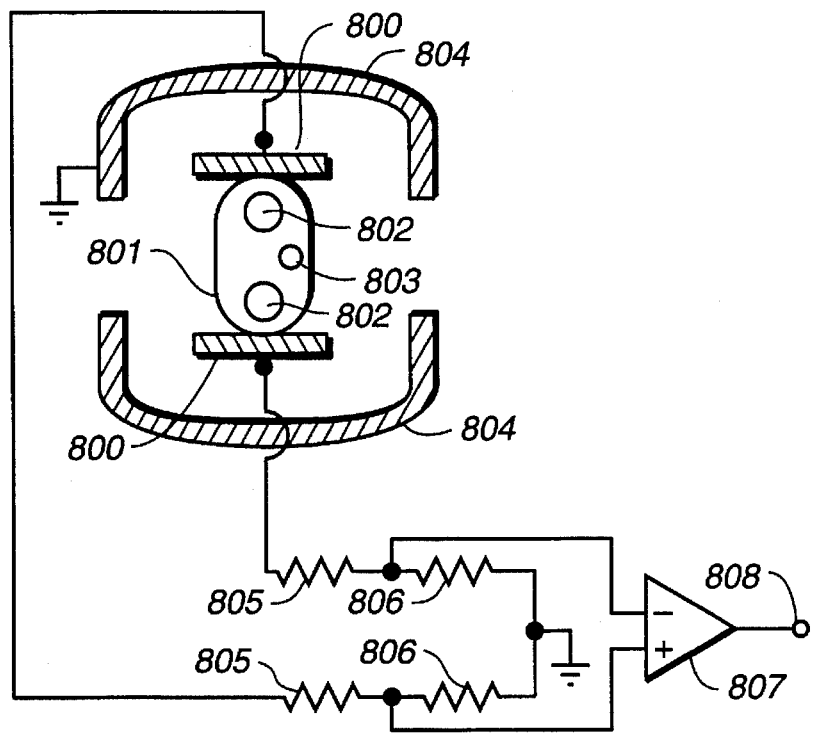
FIG._8
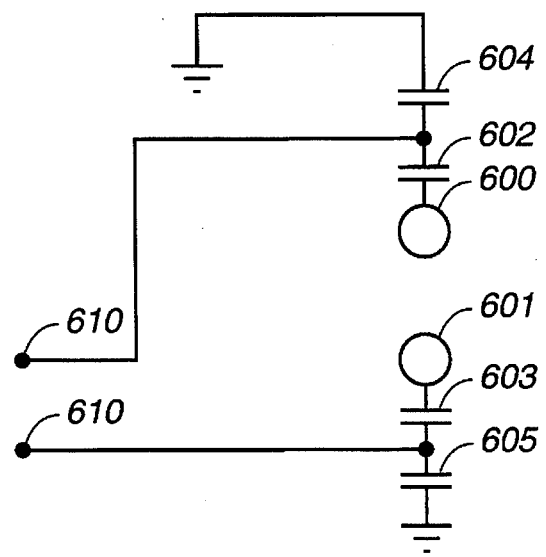
FIG._9

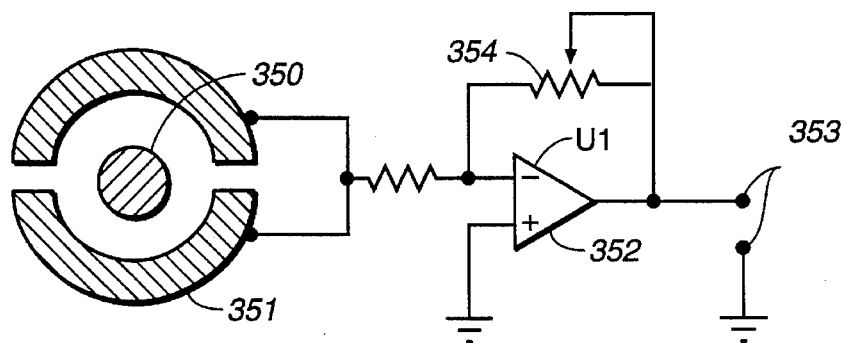
FIG._10
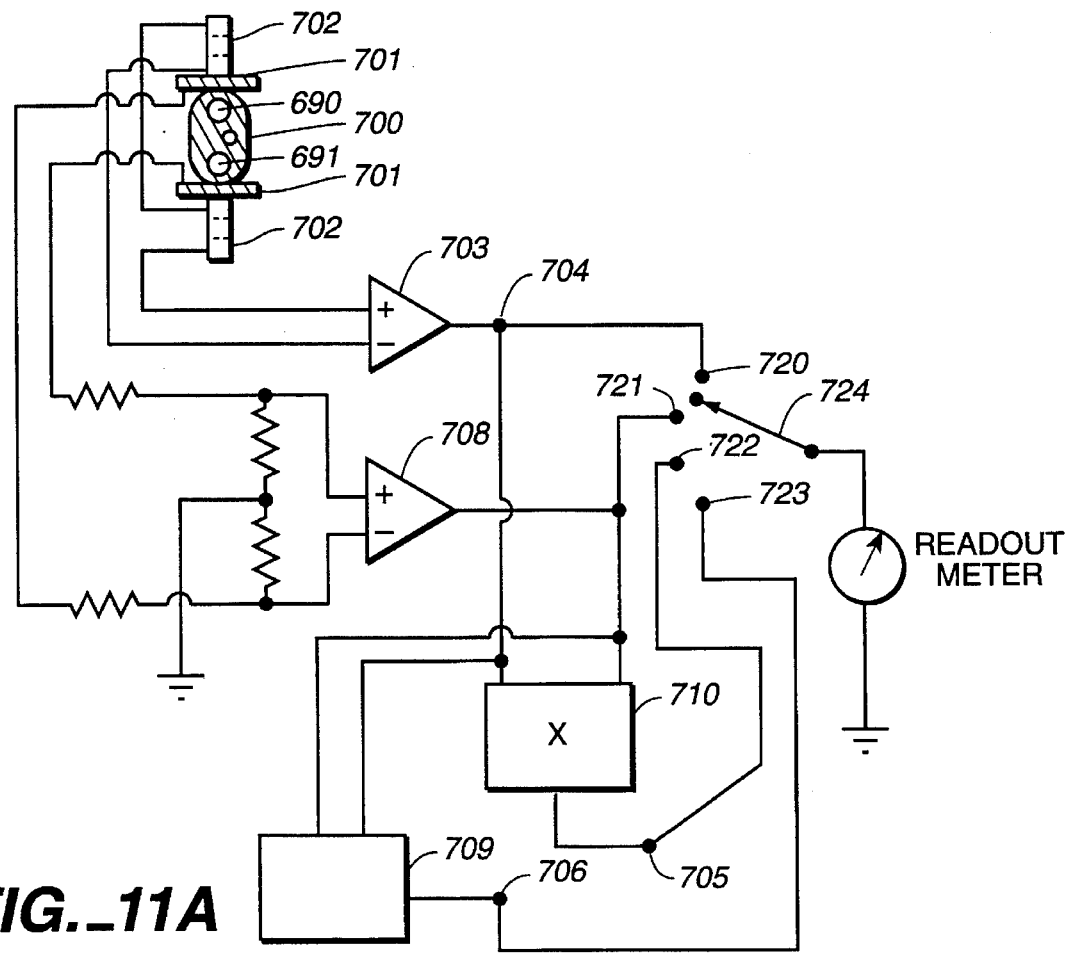
FIG._11A

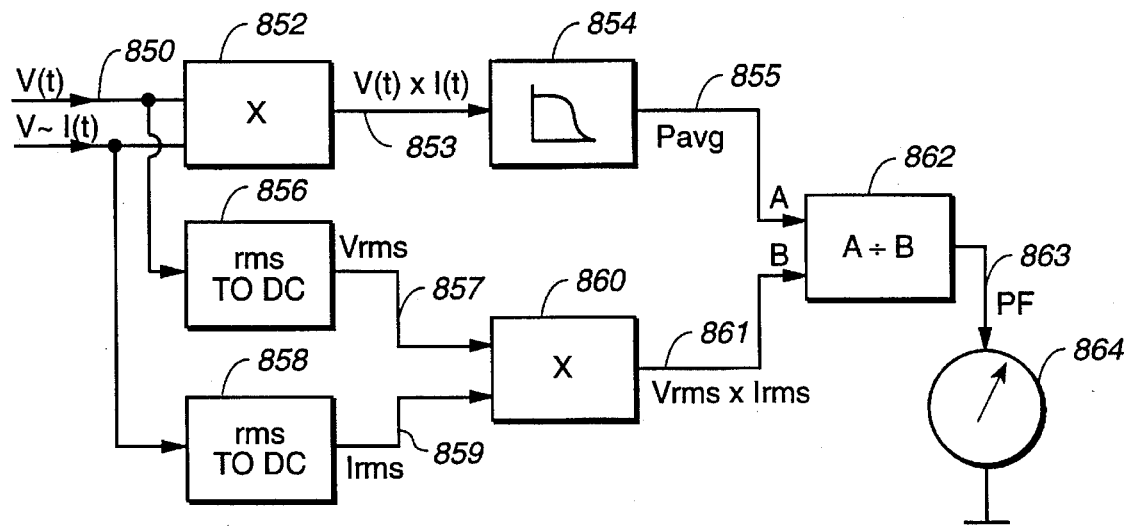
FIG._11B
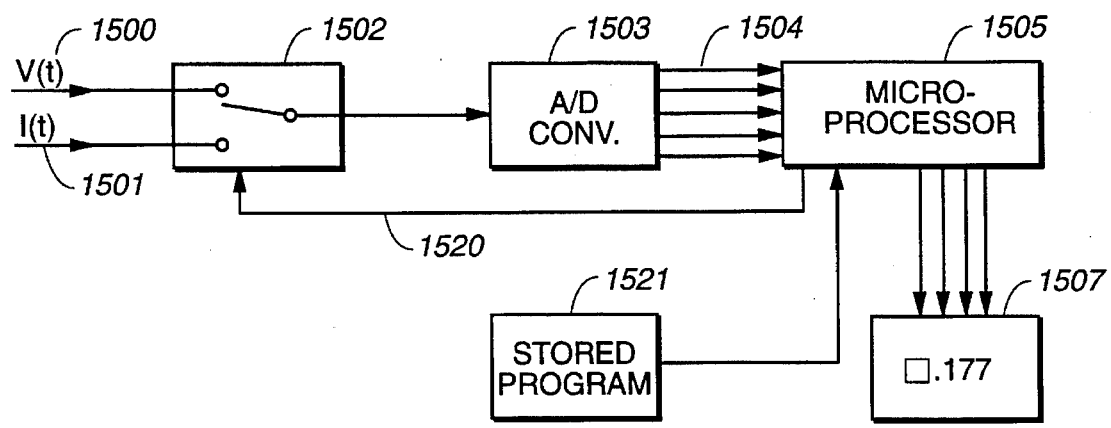
FIG._11C

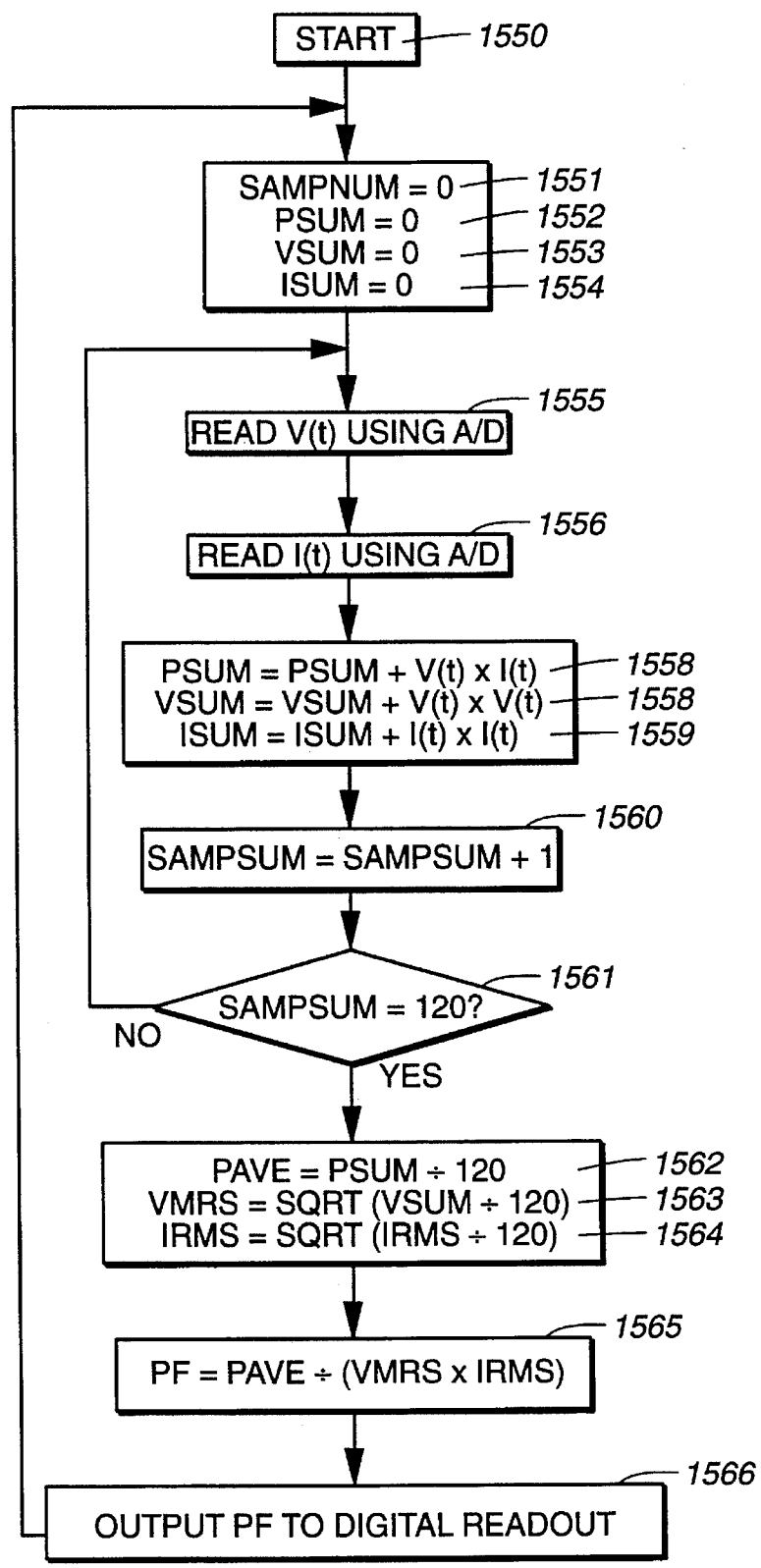
FIG._11D

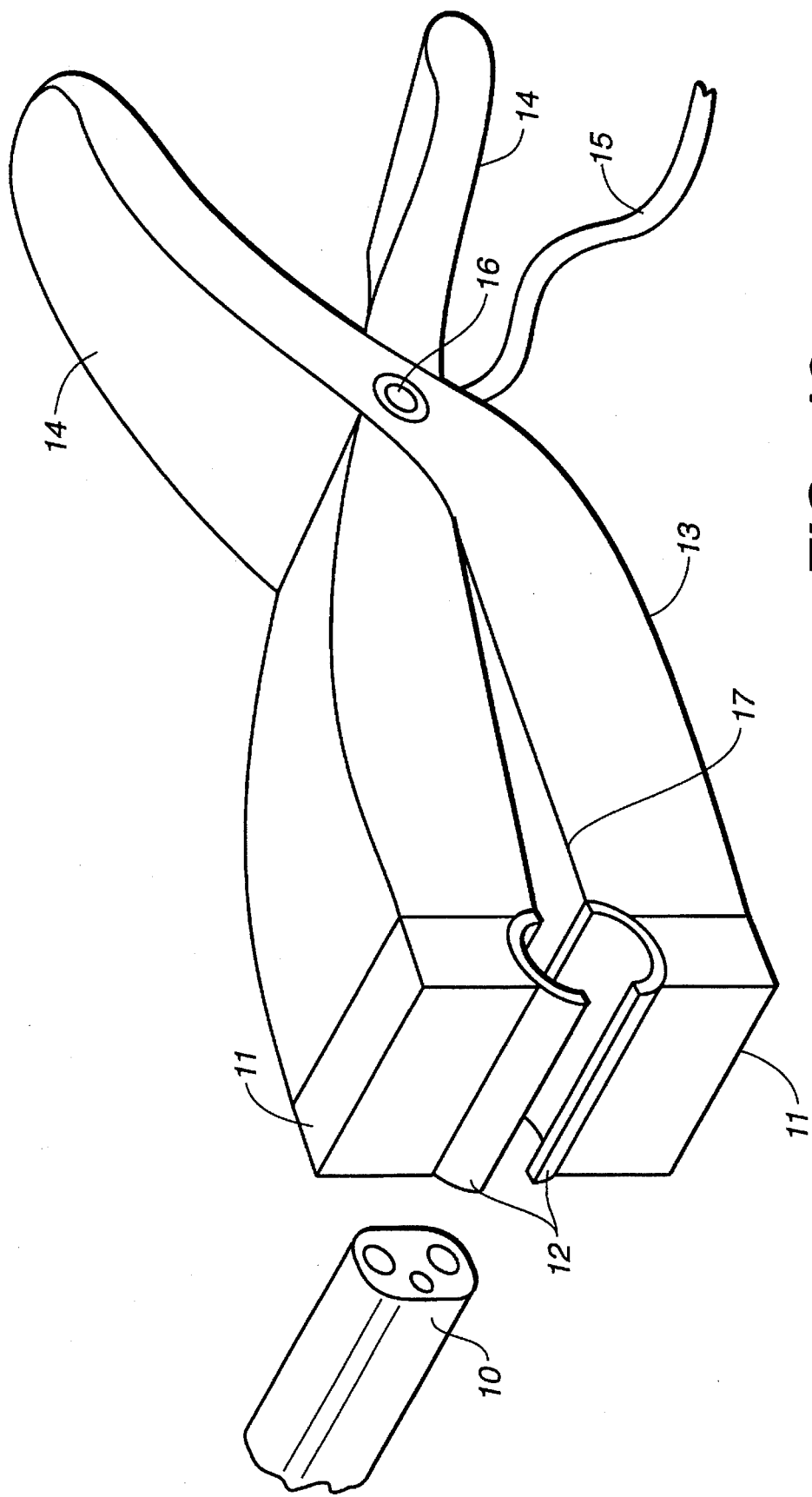
FIG._12

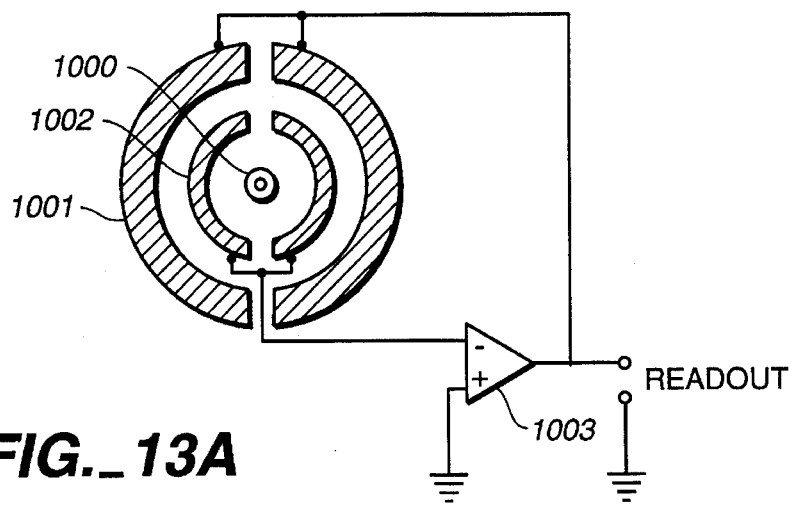
FIG._13A
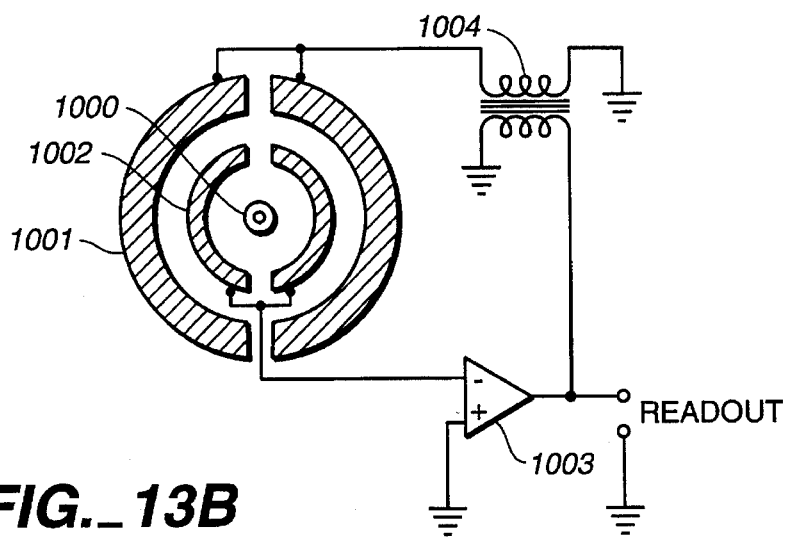
FIG._13B
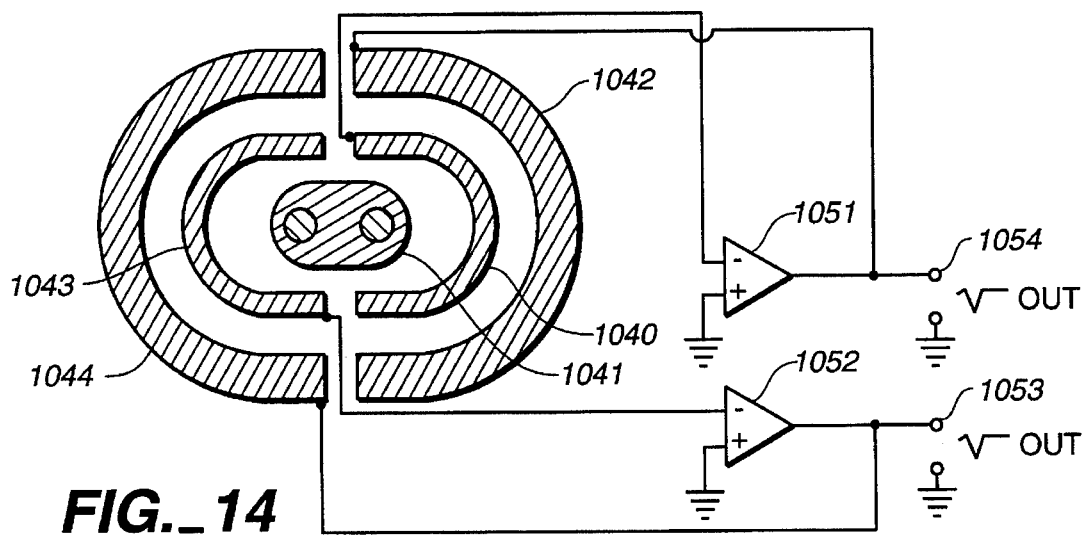
FIG._14

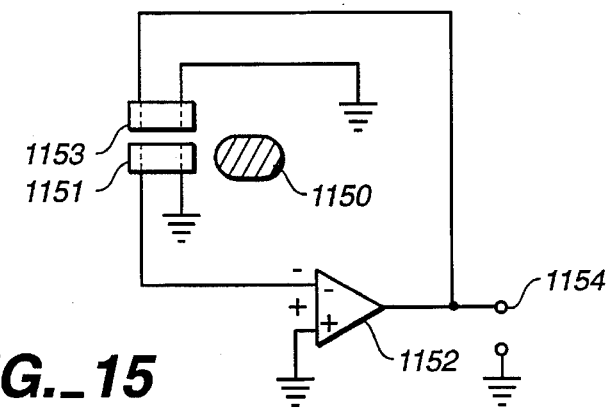
FIG._15
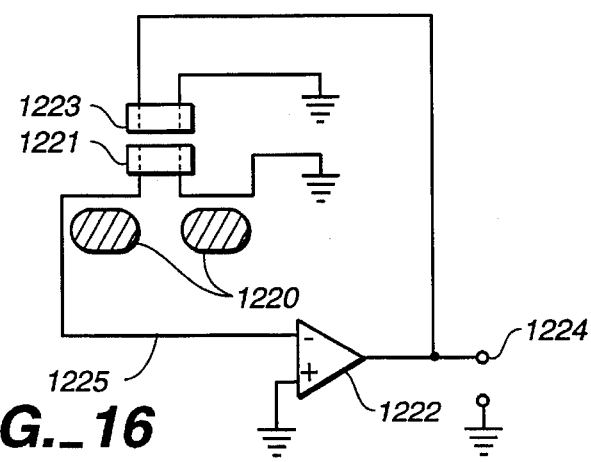
FIG._16
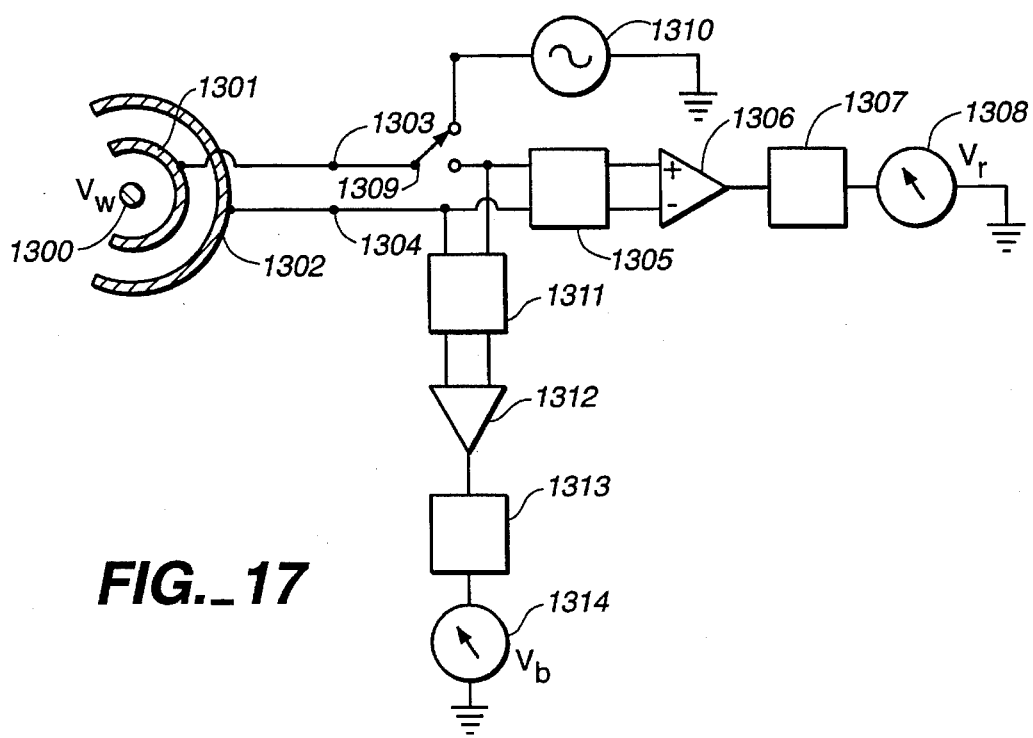
FIG._17

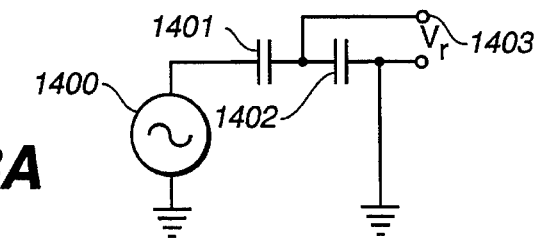
FIG._18A
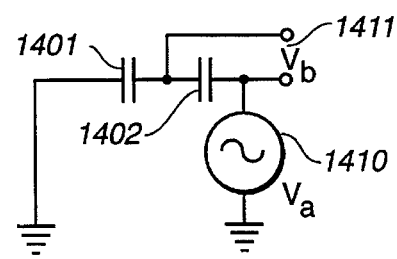
FIG._18B
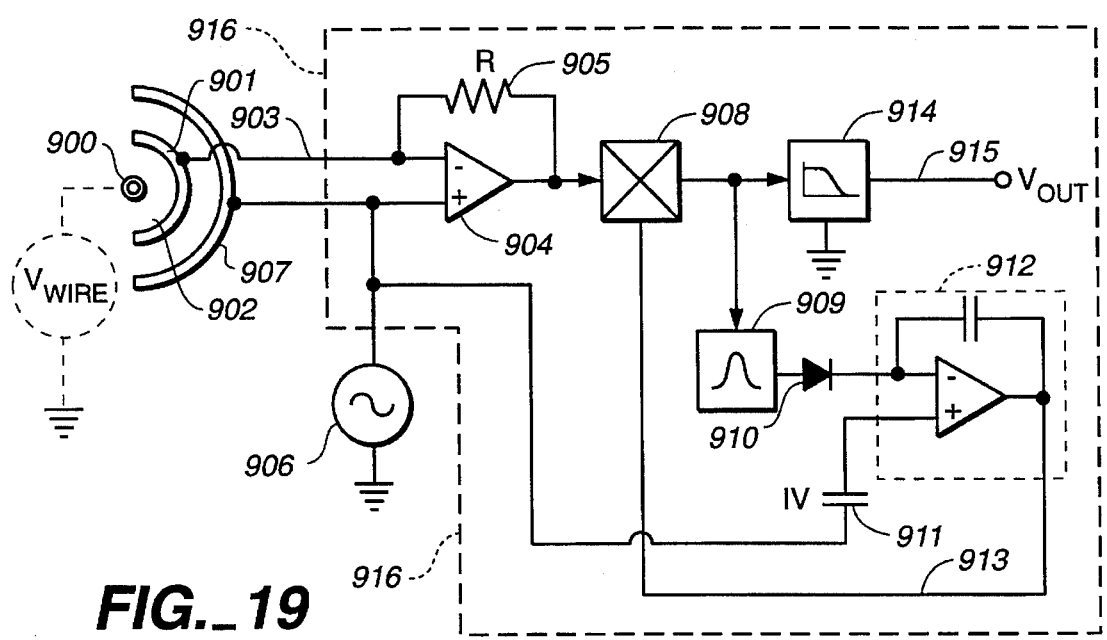
FIG._19

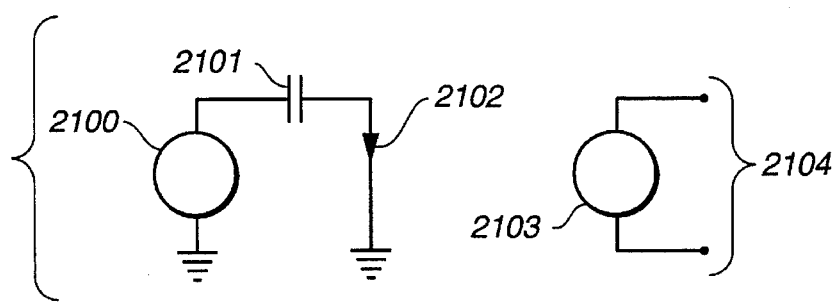
FIG._20A
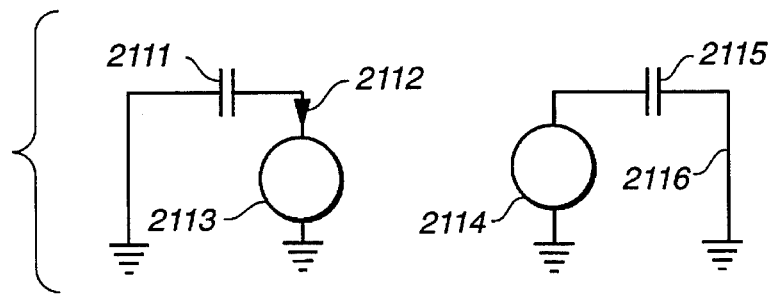
FIG._20B
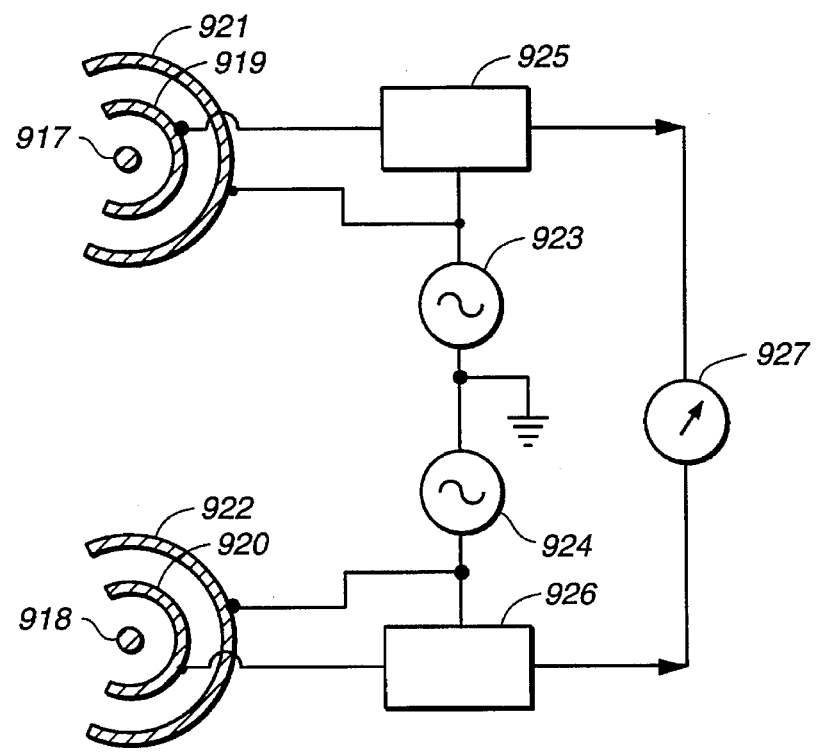
FIG._21

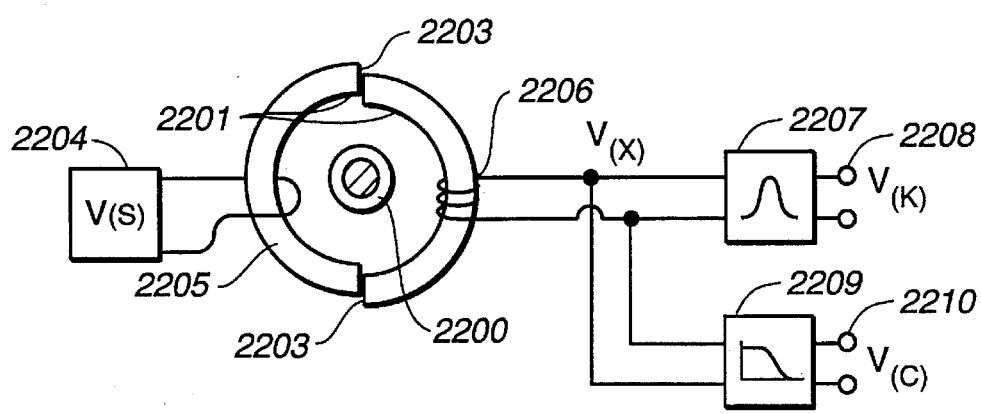
FIG._22A
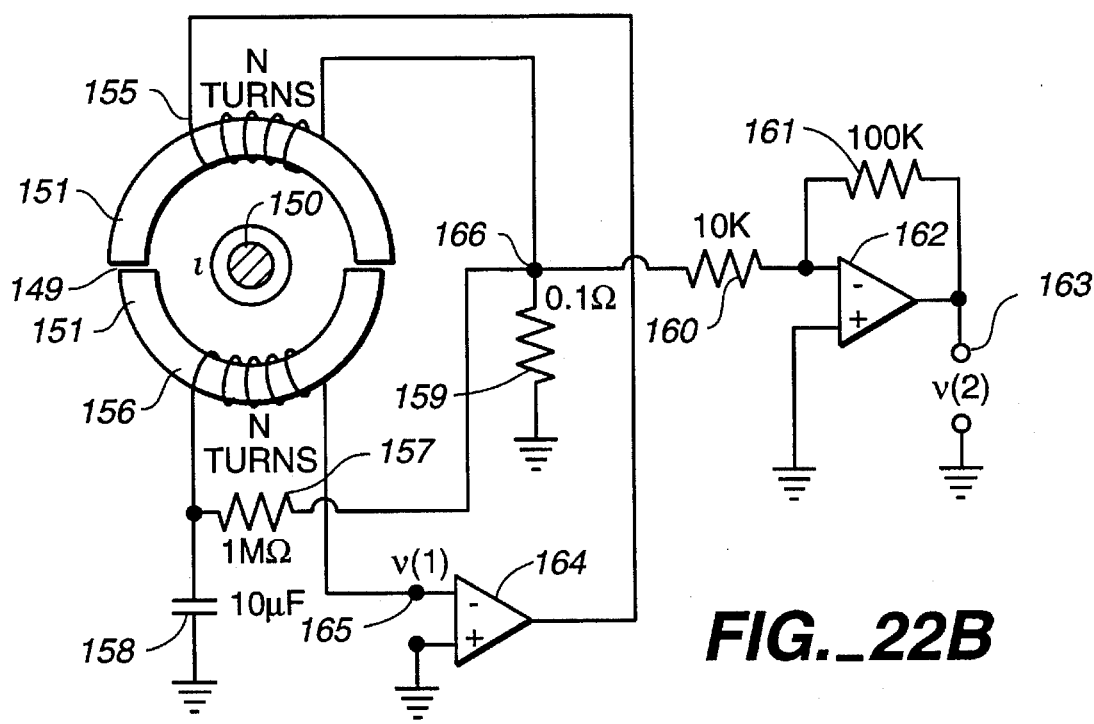
FIG._22B

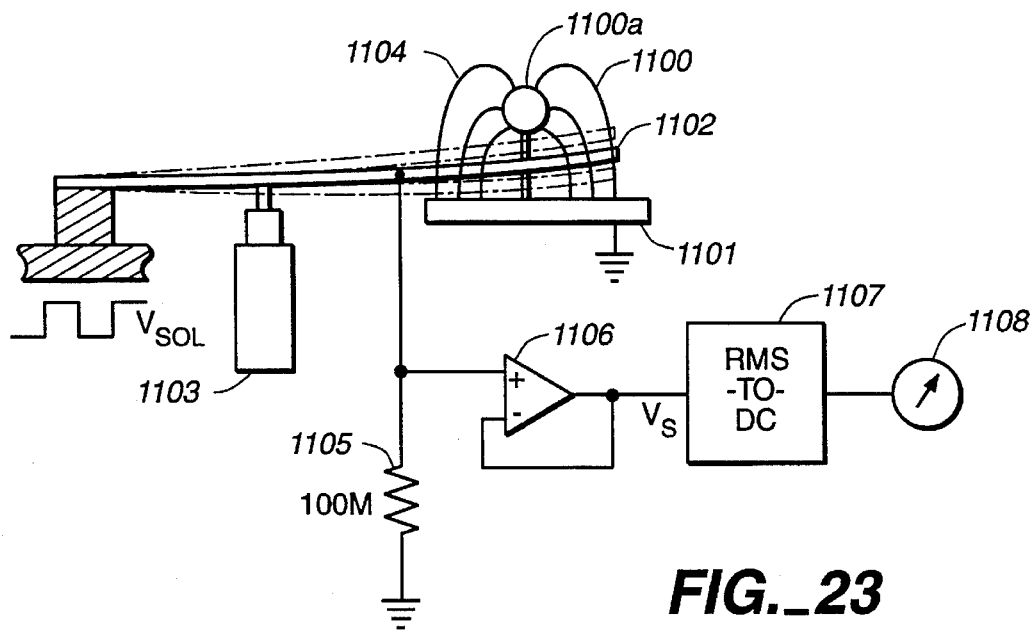
FIG._23
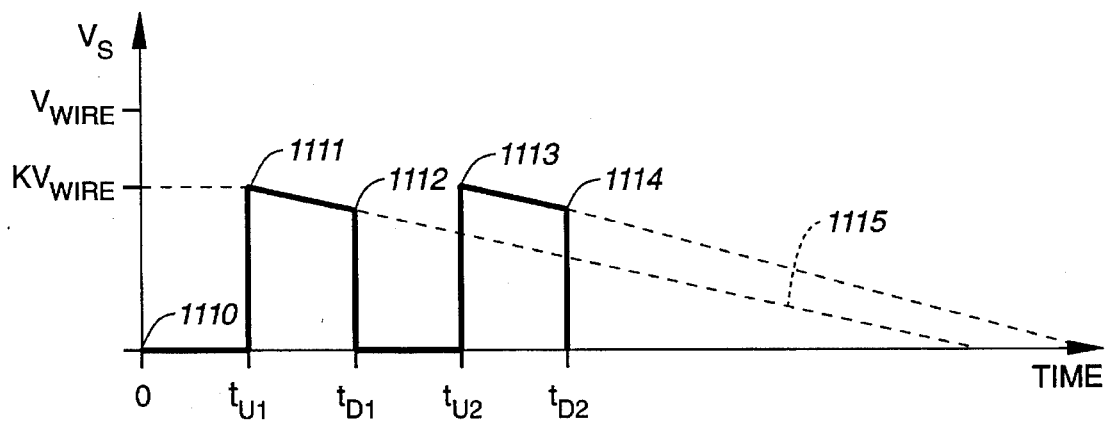
FIG._24

APPARATUS FOR MEASURING VOLTAGES AND CURRENTS USING NON-CONTACTING SENSORS

This is a continuation of application Ser. No. 07/946,979 filed on Sep. 17, 1992, now abandoned.

The present invention relates to systems and methods of measuring the voltage, current and power levels of conductive elements such as wires, cables and the like.

BACKGROUND OF THE INVENTION

The measurement of current, (and often power, especially for a constant voltage system), by measurement of the magnetic field about a single wire is a well established measurement procedure. Equipment for such measurements are often called clamp-on or snap-on current measurement meters. Such equipment is manufactured by many companies such as Hewlett-Packard, Fluke, Amprobe, Philips, & others. For a.c. measurements, a coil wound around a ferromagnetic core is commonly used as a sensor, (or "pickup device" to detect), the current flow. The ferromagnetic core is then snapped closed, or nearly closed about the single current carrying wire so that the current induces a magnetic field in the ferromagnetic core which acts as a transformer to produce a voltage in the coil wound about the core. The voltage is then amplified or attenuated to give a calibrated meter reading of the current.

A related system is presently manufactured to measure both d.c. and a.c. currents and power. In that system, transformer coupling is generally not utilized. The magnetic field of the current carrying wire is employed to operate upon a hall effect device, and the hall effect device provides a voltage which is proportional to the current in the current carrying wire. The voltage is, once again, amplified or attenuated to provide a meter reading giving the current in the wire, or alternatively, (when the voltage is known), the power carried by the wire. Direct contact methods are utilized to pick up voltages and currents from low intensity sources such as printed circuit traces, the human body, and telephone systems. The present invention would provide a contact-free method of measuring such low intensity sources.

To summarize, commercially available contactless current and power measurement systems utilize the magnetic fields surrounding a single current carrying wire and employ sensors such as solid state hall effect sensors for both a.c. and d.c. current measurements. Alternatively, the sensor employed for a.c. measurements is frequently a coil of wire, (a transformer type of sensor). With either type of sensor, a voltage which is proportional to the current is sensed. The voltage is then amplified or attenuated, (scaled), and metered to provide a reading of the current in the current carrying wire. In most of these measurement systems a ferromagnetic structure is employed to concentrate the local magnetic field. A ferromagnetic structure also tends to shield against the effects of extraneous magnetic fields, and is a useful adjunct to these basic commercial single wire current measuring devices. There are no commercially available non-contact systems which measure the voltages in the wires for single conductors, cables, or printed circuit board traces. There are no commercially available non-contact systems for measuring currents in cables, that is, multiple conductor assemblies bound together, either.

SUMMARY OF THE INVENTION

In summary, the present invention provides a method and apparatus for performing non-contacting measurements of the voltage, current and power levels of conductive elements such as wires, cables and the like. A non-contacting voltage measurement system of the present invention includes an arrangement of capacitive sensors for generating a first current in response to variation in voltage of a conductive element. Each sensor is positioned in an electric field of the conductive element, and is thereby coupled to the conductive element through a coupling capacitance. A reference source drives the capacitive sensor arrangement at a reference frequency so as to induce the flow of a reference current therethrough. A measurement network is disposed to calculate the coupling capacitance based on a measurement of the reference current, and to then determine the voltage in the conductive element based on the first current and the coupling capacitance. Measurements of a composite current through single or multiple-element conductors may be effected using a similar procedure, wherein the composite current induces a measurement current to flow within a set of coils positioned in a predetermined manner proximate the conductor. In both current and voltage measurements a balancing procedure may be employed, in which a measurement signal is balanced by a feedback signal so as to improve accuracy and reduce the effects of stray coupling.

BRIEF DESCRIPTION OF THE DRAWINGS

Additional objects and features of the invention will be more readily apparent from the following detailed description and appended claims when taken in conjunction with the drawings, in which:

FIG. 1A is a representation of the electric field lines and the magnetic field lines surrounding a single current carrying wire. FIG. 1B is a representation of the electric field lines and the magnetic field lines surrounding a pair of wires carrying identical currents in opposite directions as is typical of a two wire cable.

FIG. 2A schematically shows a method of measuring the current flow in a two wire cable using a pickup coil and an amplifier system. FIG. 2B schematically shows another configuration for measuring the current flow in a two wire cable. Both of these figures exhibit a method of measuring the current in two wire cables with a degree of invariance of the measurement by using a tapered probe for different sized cables.

FIG. 3 schematically depicts an electrical procedure for obtaining invariance of current measurements in two wire cables.

FIG. 4 schematically depicts a method of measuring currents in two wire cables with invariance as to the orientation of the cable relative to the current sensors.

FIG. 5A shows a multiple wire cable with multiple sensors which may be utilized to determine the currents and/or voltages in each of the wires. FIG. 5B depicts the flow diagram for an algorithm which may be utilized to determine the current in each wire of a multiple wire cable in conjunction with a computer analysis of the sensors of FIG. 5A.

FIG. 6 schematically indicates the circuit for adjusting the gain and shows an optional rms converter which can be used for the readout system to a meter.

FIG. 7 schematically shows a method of compensating for the wire spacing of cables to obtain invariance with regard to current read out.

FIG. 8 schematically shows a method of obtaining the voltages on a cable by detecting the electric fields surrounding the cable.

FIG. 9 shows an equivalent circuit for the method of obtaining the voltages on a cable.

FIG. 10 schematically shows a method for obtaining the voltage on a single wire relative to the ground potential.

FIG. 11A schematically shows a method for reading the current, voltage, power, and power factor on a two wire cable. FIG. 11B shows an analog procedure for obtaining the power factor. FIG. 11C shows a digital procedure for obtaining the power factor. FIG. 11D is a flow chart illustrating an algorithm for digitally obtaining the power factor.

FIG. 12 is a drawing of a combination current and voltage clamp-on instrument for two wire cables.

FIG. 13A schematically shows a feedback system for reading out the voltage on a wire or voltage source. FIG. 13B schematically shows the same feedback system with the addition of a transformer to accommodate larger voltages.

FIG. 14 schematically shows a feedback system for reading out the voltage on a two wire cable.

FIG. 15 schematically shows a feedback system for reading the current on a single current carrying wire.

FIG. 16 schematically shows a feedback system for reading the current on a two wire cable.

FIG. 17 schematically shows a system for measuring the voltage on a single wire relative to ground using a testing current source to obtain the capacitive parameters and thereby achieve good accuracy.

FIG. 18A shows an equivalent circuit used to describe the procedure for accurately determining the voltage on a wire. FIG. 18B shows another equivalent circuit to further describe the procedure for accurately determining the voltage on a wire.

FIG. 19 schematically shows a method of measuring the voltage on a wire relative to ground potential using a locally generated signal source.

FIG. 20A and FIG. 20B show equivalent circuits designed to explain how to carry out a non-contacting voltage measurement.

FIG. 21 schematically illustrates the procedure for non-contacting measurements of the voltage between two wires.

FIG. 22A schematically shows an improved method of measuring current with a current transformer.

FIG. 22B schematically shows a feedback method of measuring current using a current transformer which automatically corrects for losses and non-linearities.

FIG. 23 schematically shows a non-contact method for measuring d.c. voltages.

FIG. 24 indicates the waveform obtained by utilizing the d.c. measurement procedure.

DETAILED DESCRIPTION OF THE PREFERRED EMBODIMENTS

The present invention employs the detection of the fields about wire(s), or electric signal sources (which may be in the form of cable or of wire pairs, or sets of parallel wires, or multiple wire conductors, either bundled together or separated as in the case of power line systems using either or both electric field sensors and magnetic field sensors to determine the voltage(s), and the current(s) of the wire(s). The signal processing of the sensor(s) is carried out using either analog or digital signal processors. Microprocessors provide a convenient means of analyzing the detected fields to provide exact outputs of the voltage(s), current(s), power(s), and power factor(s) in the wire(s). The electric field sensors described here utilize a capacitive field sensor, however other field sensors may also be employed to measure the electric field about the wires, and thereby determine the voltage level of the wire or wires. Other electric field sensors which are just as useful and advantageous in some instances include: force transducers which measure electrostatic forces exerted on charged objects, field effect transistors, electron beams which are deflected by electric fields, and other similar sensors. Likewise, magnetic sensors which may be used for this invention are: wire coils, hall effect elements, magneto-resistive elements, vacuum tube sensors which detect and measure magnetic fields by electron beam deflection, saturable core reactors, flux gate magnetometers, and many other sensors which are detectors of magnetic fields. Any of these above-mentioned sensors may be substituted for the sensors discussed in this patent application and may work just about as well. Basically, the present invention provides a method for measurements of voltage, current, power, and power factor by means of utilizing sensors of the electric and/or magnetic fields in the vicinities of wires or other sources and thereby obtaining readouts of these measurements without the need to contact the bare wires, or the voltage sources. The present invention is therefore a contactless voltage, current, and power measurement system. In addition, for some measurements, the present invention utilizes a voltage or current balance system whereby the measurement system balances the voltage or current to be measured with a feedback voltage or current which greatly enhances the accuracy of the measurement.

A power line or a communication line may be considered as a transmission line wherein the magnetic and electric fields determine the nature of the energy transfer down the line. The transport of power or information follows the wire(s) because the electric fields terminate on the wire(s) and the magnetic fields surround the wire(s). For example, the electric and magnetic field lines surrounding a current carrying wire and a current carrying cable, (wire paid, are illustrated in cross section in FIGS. 1a and 1b. The electric field lines are indicated by the labeling 1 while the magnetic field lines are indicated by the labeling 2. (Only a few of the field lines are so labelled). We will describe how one can measure the voltage, current, power, and power factor of the line(s) by sensing the electric and magnetic fields in the vicinity of the wires. We can also carry out the same measurements for other types of lines such as phone lines and data transmission lines. Furthermore, using the voltage balance method described here, we can measure the electric fields of the body to provide a contact-less electro-cardiograph, (EKG), or electroencephalograph, (EEG), both of which measure skin potentials due to voltage sources within the body.

In the more complex sets of current carrying wires such as multi-phase currents, an analog integrated circuit or a microcomputer is utilized. In the case of complex cables and multi-phase currents the electric and magnetic field configurations are such that a microcomputer integrated circuit chip can sort the electric and magnetic fields out and attribute the correct values to each conductor. In the case of single phase current carrying wires, simpler procedures for determining currents and power are described herein, but microprocessors may also be used to advantage even for these simpler systems.

FUNDAMENTAL PHYSICS OF CURRENT CARRYING WIRES

The magnetic field surrounding a single current carrying wire is given by Maxwell's equations, more specifically, the equation for the magnetic field surrounding a current carrying wire is termed, "ampere's law" which is, in integral form, $$\int_c H \cdot dl = i$$

where H is the magnetic intensity vector, dl is the element of the closed curve surrounding the current carrying wire and i is the current carried by that wire. The integration is about a closed curve c surrounding the current carrier.

If we integrate equation 1 About a current carrying wire, at a fixed radius r, we obtain, $$B = \mu i/(2\pi r) \qquad 2$$

where B is the magnetic flux density found at the locus r distant from the wire which carries a current i. µ is the magnetic permeability of the space, and the preferred units are MKS units. It is clear that by measuring the value of B with a sensor at a distance r from a current carrying wire that one can also measure i, the current carried by the wire since the values of r and µ are constants of the measurement. The establishment of the distance r is accomplished by utilizing a standard spacing configuration.

The above exposition describes both a.c. and d.c. fields. For a.c. fields, the current varies with time of course, but it is a simple matter to average or take the root mean square (rms) of the measured value of B to obtain the rms current. The averaging or rms value is obtained by rectifying the output using an operational amplifier rectifier so as to reduce the rectification error, and by using an rms to d.c. converter which outputs rms values. Such types of integrated circuit converters are readily available from standard catalogs of manufacturers such as Burr-Brown Corporation or Analog Devices Corporation. We now consider how to measure multiple wires with more than one phase. If two or more current carrying wires are brought close together or in a neighboring space such that the magnetic fields neighbor each other, as in the case of wire pairs, wire triplets, or wires on transmission lines, then one must consider the net value of the magnetic field at the measurement position or positions if the currents are to be measured by means of the magnetic field values.

The magnetic flux density B at any point due to multiple current carrying wires can be found by the principle of superposition. The application of the superposition principle requires that we consider the instantaneous value of B due to all of the current carrying wires at a point, suppose the point, r(1). The net value of B is then the vector sum of all of the values of B produced by all of the wires at a given instant of time at the point r(1). Frequently, one need not consider the instant of time because the rms value of current is the desired measurement. However, in some cases, the instantaneous values are of importance because the phase is required in order to accurately measure the power factor. The power factor can be measured by determining the phase lead or lag of the current versus the voltage.

Some two wire current measuring systems

For some common forms of two wire cables such as Romex cable which is in very common use, the spacings of the wires are quite specific. Romex is a trade mark of the General Cable company use on two, three, and more wire cable. The term "Romex" is in such common use that most manufactured cable of similar form is termed "Romex", and the term has become generic. We are not specifying that our system is designed to accommodate Romex cable especially. Our system is designed for all types of cables. However, we mention Romex cable here in order to provide a convenient mental picture for the description of our measurement system.

A simple system for measuring Romex cables can be constructed whereby the spacing for the measuring system places the magnetic field sensor in a specific position relative to the wire pairs of the Romex cable. Several of the systems which we have designed to measure Romex cable currents are shown in FIG. 2. The system can be generalized to measure many different sizes of cables, (either Romex or other types of cables), by setting the mechanical spacing so that it automatically compensates for different wire spacings and sizes and maintains a distance r away from the wire pair such that the voltage output 104 or 114 is invariant with regards to the wire spacing or cable size, and is thereby directly proportional to the current in the wire. It is generally convenient to provide a scaled voltage output. For example, one might scale the voltage output by setting the amplifier, 103 or 113 to have a specific gain and give 1 millivolt output per ampere. One can also accommodate widely varying types of wire cables by providing a variable gain amplifier which can be set to accommodate different sizes of wire pairs, and can be set for different calibration values. In addition, the cable "gripper" 101 and 111 is set to change the spacing between the coil sensor 102 and 112 and the wires of the cable according to the size of the cable in order that the measurement of current be invariant with respect to cable sizes, (and wire spacings within the cable.)

Another aspect to maintaining the voltage output to be a function of the current only and not a function of the wire cable spacings is to set the op-amp,(103 and 113), gain according to size or type of wire cable being measured. This is done by adjusting potentiometers 105 and 115. Setting the gain for the size of the wire cable provides great flexibility in utilizing the cable current measuring system for measurements of current in cables of widely different types. In essence, setting the gain provides a calibration for any type of cable, and excellent accuracies are attainable thereby.

FIG. 3 shows one example of an automatic compensation system whereby the calibration for different types of cables is a function of the size of the cables. Here the potentiometer 205 is set by the opening of the cable holder to accommodate the cable 200. The sensor coil 202 is shown parallel to the wire pair cable. Other positions for the sensor can be utilized just as well. The sensor can be a coil of wire or a solid state element such as a hall effect or magneto-resistive sensor. In addition, other types of current or magnetic field sensors may be utilized. The apparatus for positioning the sensor is designed to provide a consistent position for cables of different sizes and thus sense a magnetic field which is proportional to the current carried by the cable wires. The positioning apparatus thereby provides a sensing position which allows the sensor to respond to the magnetic field of the current and minimizes variations due to the wire spacings within the cable. The pivot 217 permits the jaws 218 to open so as to accommodate wires of different sizes. The use of a ferromagnetic core or ferromagnetic shield 215 provides for a more isolating measurement of the current, and can be utilized to reduce the effects of stray magnetic fields from nearby sources such as wires or cables. Also the cable holder 216 incorporates an adjustable potentiometer, 205 (or alternatively, a switching system), which automatically adjusts for cables of different sizes by changing the op-amp gain to compensate for the different wire spacings.

In FIG. 4 the four coils 400, 401, 402, 403 are oriented differently relative to the wire cable 406, they are 90 degrees apart. They may also be oriented at some other intermediate angle to pick up the magnetic field of the cable. In addition, we note that by using two or more sets of pickup sensors, (either the coils, or another type such as a hall effect sensor), the orientation of the cable 406 relative to the sensors may be canceled out—that is—invariance of the readout voltage for different cable orientations is achieved. For two pickup sensors this is due to the summing of the squares of the pickup voltage and the use of the pythagorean theorem. The spring 405 is used to clamp the cable into place. The amplifiers 409 and 411 shown here are instrumentation amplifiers and the outputs 410 and 412 of these amplifiers are squared, 413,414, summed, 415 and the square mot of the sum of the squares, 416, is provided by the integrated circuit 416. The output 417 is then read out by a voltmeter 418, which indicates a voltage directly proportional to the current in the cable. With more complex cable systems, where there are two, three, or more phases, the superposition of the phases can be approximated by an analog procedure. Currents can be measured in the most common three phase cables using the fact that the cable spacings are standard, and that the three phases relate to each other in a relatively constant manner.

In some cases, it is necessary to carry out a complex superposition calculation in order to determine the vector sum of the magnetic fields and the electric fields and determine the net effect of the superposition of all of the fields at various sensor positions. For those cases, we have designed a microcomputer system to evaluate net currents at different points using magnetic field sensors and the net voltage at different points using electric field sensors. FIG. 5A is a possible arrangement of nine sensors 500 which surround the cable 501 comprised of five wires with various phases and currents. The sensors 500 pick up the magnetic fields and their outputs are multiplexed by the multiplexer 502, digitized with an analog-to-digital converter 503 and then output 504 to a microcomputer which is then programmed to sort out the respective currents and the phases of the wires in the cable 501. The mapping of the sources by microcomputer is a relatively straightforward program which the microcomputer can readily accomplish. The procedure carried out by the microcomputer is to calculate the currents carried by each wire and vectorially add up the expected magnetic field at each of the sensor positions. To carry out the calculation, the computer utilizes all available information such as the position of each sensor, the spacings of the wires, 501, which may be a set of transmission wires on a pole or may be a bundle of wires in a cable. The calculation is an iterative process. First the currents carried by each wire is assumed to take on particular values, then the magnetic field at each sensor is calculated using a program 505, or a lookup table 506. The expected sensor response is then calculated for the position of each sensor. Then the actual measured sensor response is compared with the calculated sensor response using the assumed currents. The assumed currents are then increased (or decreased) in the computer calculation as required to achieve closer agreement with the measured sensor responses. The computer calculation using the newly assumed values is then carried out again and the net expected sensor outputs are calculated using the lookup tables or the programmed superposition concept in program 505. Once again the actual sensor response is compared with the assumed currents and the calculated sensor response. If they do not agree, the assumed currents are changed and the calculation and actual responses are again compared. The iterative calculation and the comparisons are repeated until there is agreement, (within a certain error tolerance), between the expected response and the actual response of the sensors, at which point the current flow of each wire in the array is completely determined, and the output values 504 can be recorded, telemetered, or otherwise transmitted to the person or system in control.

FIG. 5B shows the flow chart for solving for the currents or voltages in a complex array of wires. The initial sensor values, (the sensors may either sense currents or voltages depending upon the type of sensors; the algorithm is the essentially the same), are multiplexed 175 and are transformed into digital values by the ND conversion 176. The computer then provides a set of assumed values 177 for the wire currents, (or voltages), based upon an educated guess as to the most probable currents or voltages in each of the wires in the complex array. The set of assumed values then are transferred to 179 where a calculation of the expected sensor values is obtained using a straightforward application of Maxwell's equations and the superposition theorem. In 180 the expected sensor values and the actual sensor values are compared. If they agree to within a small error "e" then the assumed values for the currents are output by 181. If the difference is larger than e, then the initial values assumed for the currents is modified in 178 and the process of calculation iterates until agreement is obtained.

There are two aspects which make the process converge rapidly. The first is that the number of sensors must be large enough to make the calculation converge. This is accomplished by providing enough sensors to make the problem deterministic. The second aspect is that the values of the currents, (or voltages), in the wires are initially determined very accurately, therefore the educated guess for the initial values in the wire can be very accurate and the calculation converges rapidly.

With regard to uniqueness of the solution, it is possible to have a number of different arrangements of currents within the wire array and still obtain the same set of responses. However, in the practical case, the range of currents, the approximate wire spacings, and the number of sensors can all be utilized to obtain a unique solution which would be the correct solution as to the labeling of the current in each wire of the array. This system of current determination for the array of wires applies to transmission lines where noncontacting current measurement is very helpful since the current monitoring values can be telemetered to the generating or the sub-station to provide control information which can be utilized for energy conservation. The system can also find important usage in test and monitoring of wire cables in electrical equipment where determination of the current distribution among the wires can be of great value in evaluating the status and reliability of the equipment. The same geometry shown in FIG. 5A applies to voltage sensors such as those described later in this patent. The same calculation can be carried out using the superposition of electric fields and the expected voltage at the points where the electric field provide the sensors with a voltage determination using superposition of the electric fields due to the array of wires. Once again, it is an iterative calculation where the computer assumes a certain voltage on each of the wires in the array, then calculates or looks up the expected field at the position of each sensor, compares the calculated and measured responses, and recalculates until there is agreement between the assumed voltages and phases on each wire and the actual sensor values. It might seem that the calculation would be lengthy, but in fact, because of the limited range of voltage and current values, and the strategic placement of the sensors, (both for voltage and for current), the calculation will converge quite rapidly whether it is for the current case, (with current sensors), or the voltage case, (with voltage sensors). The appropriate voltage sensors and voltage signal conditioners are described later in this patent.

In essence, an array of wires with various voltages, phases, and currents is essentially imaged by the computer procedure described here. It is also practicable to utilize one or a few sensors and move these sensors or sensor to a number of different positions to determine the current or voltage distributions in an array of wires or sources.

The above system of computer calculated voltage and current determination for complex arrays of wires is a form of projection imaging applied to the magnetic fields, and the electric fields. Such projection imaging techniques as back-projection, fourier transform reconstruction, and other common reconstruction programs can also provide the computer with the methods needed to compute the currents in the cable(s) and calculate the currents attributed to each wire. An appropriate electronic system for amplifying or attenuating the current sensor voltages is shown in FIG. 6. Following the amplification, in the op-amp 300, with the adjustable gain potentiometer 301, it is often convenient to rectify the voltage using for most cases, a "true rms" rectifier circuit 302 the output can then be displayed using a digital or analog meter calibrated so that the readings are in current or power units,(amperes or watts). If the voltage is constant, then the current flow is directly proportional to the power, (except for the power factor, which is important to consider when capacitive or inductive loads are utilized.) For overhead power cables and sets of wires, these procedures may be employed to calculate the currents and voltages in each of the wires or cables. The positioning of the sensors can be easily determined to provide the optimum number of data elements required to provide an accurate calculation for the currents and the voltages. The principle of superposition wherein the magnetic fields from many sources add vectorially, and independently, the electric fields from many sources also add vectorially, allows for the calculation in a straightforward method.

Special considerations

The spacings between the wires of a cable determine the values of the electric field and the magnetic field at any specific locus in space since these fields are determined by the addition or subtraction of the total field values of all of the wire conductors at that locus in space. For some classes of cables in which the wire spacings vary, either because of manufacturing variations or because of different wire sizes, it is advantageous to minimize readout variations in reading the currents and the voltages. There are several straightforward methods to accomplish this. Certain spatial placements of the sensors have less sensitivity to the spacings of the wires within the cable. Another method is to utilize several sensors which are placed in positions where an increase in wire spacing within the cable will increase the readout of one or two sensors while the same increase in wire spacing will decrease the readout of one or two sensors placed in a different position. By adding the readouts of the different sets of sensors together, the total readout of the current and voltage from the cable wires can be tailored to maintain an accurate result essentially independent of the wire spacings.

As an example of methods which we employ to compensate for different sizes of wires with different spacings between the wires within the cable, we illustrate with FIG. 7 a case of adding, (or subtracting), the pickup of several sensors. We illustrate by adding the voltage pickup of two sensors 310, 311 to compensate for variations in the wire spacings within cables. The two sensor outputs are added together in the op-amp 312. When the wire spacings increase, sensor 311 senses an increased voltage while sensor 310 senses a decreased voltage. By combining the two voltages sensed, the total voltage readout 313 can be maintained fairly invariant with regards to the wire spacings within the cable. This compensation method is applicable to both electric field and magnetic field sensors and in both cases can compensate for variable wire spacings within the cable and maintain the readout 313 invariant with regards to various wire spacings 314.

VOLTAGE MEASUREMENTS

Contactless voltage measurements utilize the electric field surrounding a wire or wires. Sensors to detect the electric field consist of transducers to convert the electric field into a voltage proportional to that field. In this work we will describe the simplest such transducer, a capacitor used as a voltage sensor. As described earlier, other types of voltage sensors may be used just as well.

When a capacitor is placed in an electric field,(E), the voltage across the capacitor is the integral of the field over the distance between the plates of the capacitor, c. The voltage v across the capacitor is given by the equation, $$v=q/c \qquad 3$$

This equation is difficult to solve directly especially for the complex geometries found in electric cables because the charge q is difficult to determine with accuracy.

However, as shown in FIG. 8, if we place our capacitor plates 800 on the outside of a two wire cable, or a Romex cable with two conductors 802 and a ground wire 803 as shown in FIG. 8, then the electric field is coupled to the capacitor plates. The shield 804 is connected to the center of a differential amplifier 807. The resistors 805 are of the-order of 100 megohms, and the resistors 806 are of the order of 10 megohms. The output 808 of the amplifier 807 provides a voltage directly proportional to the voltage across the wires 802. A spring holder or other clamp is useful to locate and hold the capacitor plates securely against the cable 801.

FIG. 9 illustrates the equivalent circuit of the various internal cable capacitances, the capacitance from the conductors within the cable wire 600 and wire 601 to the capacitive sensor input 610 and the capacitance to ground is shown for each side of the circuit as capacitances 604 and 605. The pickup voltage 610 is divided by the capacitances 602, 603, and 604, 605. Hence the pickup voltage 610 depends upon the relative values of the capacitance coupling the pickup plates to the cable wires. These capacitances can be determined independently, (as we shall describe in another section of this description), to facilitate the measurements. If the capacitances are maintained as a constant, then the voltage measured is directly proportional to the voltage on the wires 600 and 601. Using the fact that the output voltage is a fixed fraction of the wire voltages, we are able to measure the voltage between 600 and 601 by scaling the output voltage 808 of FIG. 8. We have therefore designed a system for obtaining the voltage between the internal wires of a cable without invading the cable, i.e., We can measure the voltage across the wires of a cable by means of a sensor of the electric field outside of the cable.

When a capacitor of capacitance c is placed in an electric field, the voltage measured across that capacitor is given by, $$v = \int E \cdot ds \qquad 4$$

where E is the electric field and ds is the element of distance between the plates of the capacitor. A linear voltage gradient simplifies the integration, but is not a necessary condition. If we now consider a pair of parallel conductors in a uniform homogeneous dielectric medium such as air with a potential voltage v between them, then the electric field between them is given to good approximation by v/s where s is the distance between the wires, (here, linearity is assumed for the sake of heuristic description of the measurement system). If we now place capacitor plates near the wires, (but not in contact with the wires), then a voltage can be measured across the plates. The measured voltage is given by equation 4. In essence, the non-contacting capacitor plates which are close to the wires are charged up to a voltage which is a constant k times the actual voltage difference of the two wires. The constant k is dependent upon the geometry, the positioning, and the dielectric constants of the materials in and near the plates. Frequently k is significantly less than 1.0, although it may be made very close to 1.0 if the capacitor plates are positioned very close to the wires.

Since the voltage divides among the capacitances near the wires, the voltage across the plates, (which is where the voltage is measured in this non-contacting voltmeter), is directly proportional to the voltage across the wires. By designing the plates so as to carefully encompass the wire cable, the impedances can be maintained to be very nearly constant, and the voltage which appears across the measurement plates is then directly proportional to the voltage across the wires. The voltage is then measured and scaled to drive a meter or provide the voltage to a computer or other device. The meter is easily directly calibrated so as to read the voltage across the wires. Often it is useful to measure the rms voltage. Measurement of the rms voltage is accomplished by utilizing integrated circuits which provide the true rms voltage as an output. Such circuits are commercially available from many manufacturers such as Burr-Brown Corporation or Analog Devices Corporation, and a number of others who are well known to those skilled in electronic design. By carefully choosing the geometry and the positioning of the wire relative to the plates, one can demonstrate a practicable non-contacting voltage measuring system which can be made accurate to within one percent. The measurement system is readily extended to different kinds of cables such as three, four, five and higher multiple wire cables. In addition, measurements of suspended wire systems such as electric transmission lines can be measured for voltage, current, and power by placing plates or other voltage sensors in the vicinity of the wires for voltage and coils or other current sensors in the vicinity of the wires for current measurements. To obtain the power, one need only multiply together the voltage and current readings times the power factor, as given below:

$$P = VI \cos \emptyset \qquad 5$$

where $\emptyset$ is the phase angle between the voltage and current waveforms and $\cos \emptyset$ is termed "the power factor".

Single Wire Measurements

The voltage between ground level and a single wire at a voltage level can also be measured using the same procedure. In this case, the capacitive tube is slipped over the wire. It is usually more convenient to split the capacitive tube and clamp it over the wire 350 as schematically illustrated in FIG. 10. The output voltage 353 is now directly proportional to the wire voltage 350 relative to the ground level. The output voltage 353 is scaled to a convenient level by the gain control 354 of the op-amp 352.

Power Measurements

It is often desirable to measure power directly because it provides a measure of the efficiency with which the user is utilizing electricity. In addition, a measurement of the power factor will indicate if the load on the power line is inductive, capacitive, or resistive, and will show the relative amount by which the load is inductive, capacitive, or resistive. By combining the two non-contacting measurements described here, that is the non-contacting current measurement with the non-contacting voltage measurement in a wire cable, one can find the power, (in watts), consumed by a load connected to the wire.

Combination of non-contacting voltage measurements and non-contacting current measurements can be accomplished by means of a measurement system, schematically shown in FIG. 11A, that combines the contactless measurements of voltage, current, power, and power factor. In FIG. 11A the wire pair or Romex cable is labeled 700. Two capacitor plates 701 couple to the electric field of the wires 690 and 691 within the cable 700 and thereby provide a voltage which is amplified by differential amp 708 to produce an output voltage 721. At the same time the two coils 702 couple to the magnetic field of the wires 690 and 691 to provide a voltage output proportional to the current which amplified by differential amp 703 to provide a voltage output 704 proportional to the current flow. The integrated circuit 710 is an analog multiplier which multiplies the voltage and the current outputs together and provides an output 705 which is the measure of the power consumed by the load on the cable. In addition, the integrated circuit 709 calculates the phase angle between the voltage wave and the current wave, IC 709 is a special integrated circuit designed to calculate phase angle. The phase angle can be calculated either with analog or digital circuitry. All of these output values are brought the points 720, 721, 722, and 723 where a selector switch 724 can be brought to connect any of the outputs desired to a readout meter of conventional nature. Alternatively, independent readouts can be provided for independent metering. Optionally, the same set of calculations can be carried out in digital circuitry or with a microprocessor and, if desired, the voltage, current, power and power factor can be stored in digital memory or displayed. The output of the analog multiplier is best passed through a low-pass filter which has a time constant longer than the period of the wave form being measured. The circuitry described here is conventional. The novelty is in the contact-less voltage and current sensing readings and the contact-less power and power factor measurements.

POWER FACTOR DETERMINATION

The power factor, "pf", of a specific load is defined as the average power, Pavg, consumed by the load divided by the product of the r.m.s. voltage, Vrms, applied to the load and the r.m.s. current, Irms, flowing through the load. This is described by the equation, $$pf = Pavg/(Vrms \times Irms)$$

The pf can be obtained by either analog means or digital means as illustrated in FIGS. 11B, and 11C, respectively.

The analog method of FIG. 11B shows a sensed a.c. voltage, V(t), 850 in phase with and proportional to the voltage detected from the sensed wire, (which goes to a specific load). Input 851 is a voltage which is in phase with and proportional to the current flowing through that sensed wire. The two voltages 850 and 851 are multiplied together with a commercial analog multiplier IC 852 to yield the product 853 which is V(t)×I(t) which is directly proportional to the instantaneous power. The product 853 is then fed into a conventional low-pass filter 854 with a typical cutoff frequency of 1 to 10 Hertz and the output is the average power, Pavg, 855. Simultaneously, the inputs 850 and 851 are converted to rms voltages by using conventional rms-to-dc converters 856 and 858 respectively. The rms voltages 857 and 859 are multiplied together by analog multiplier 860 to yield the product of the two, (which is proportional to Vrms×Irms), at 861. Pavg is then divided by 861 in the analog divider 862 to yield 863 which is the desired power factor output. The meter reading 864 can then be calibrated directly as a power factor readout. Alternatively, the power factor output can be digitized by an analog to digital converter and utilized as a computer input to provide power factor control or for analysis.

DIGITAL POWER FACTOR PROCEDURE

The determination of the power factor can also just as readily be achieved using a digital approach. An example of the method is shown in FIG. 11C. The a.c. voltage 1500 proportional to and in phase with the voltage in the sensed wire under measurement is connected to the multiplexer 1502. Likewise the voltage 1501 which is proportional to and in phase with the current in the sensed wire is connected to the multiplexer 1502. The multiplexer selects which one of the inputs, either 1500 or 1501, is to be fed into the ND converter 1503 by means of the digital control line 1520. A/D converter 1503 converts the selected input into digital form, such as a binary representation 1504 which then goes to a microprocessor 1505 which executes a stored program 1521 which computes the power factor. The power factor is then fed via digital lines 1506 to a digital readout 1507 which displays the power factor in a user-readable form. Also the power factor output can be used to relay the information or for control purposes.

The procedure used by stored program 1521 to provide the power factor in the microprocessor of FIG. 11C is illustrated in flowchart form in FIG. 11D. After the start 1550 of the program, a sample count variable SAMPNUM 1551 is set to zero. Likewise variables PSUM 1552 which is a running sum of instantaneous power is set to zero. Also variables VSUM 1553 and ISUM 1554 which are running sums of squared instantaneous voltage and current respectively are set to zero.

Next the microcomputer 1505 instructs the ND converter 1503 to convert the first voltage reading to digital form V(t) 1555. The microcomputer 1505 then sends a signal 1520 to the multiplexer 1502 causing the ND converter 1503 to receive signal I(t) and convert it to digital form 1556. The microcomputer 1505 next multiplies V(t) by I(t) and adds the result to variable PSUM as denoted by label 1557. The microcomputer next squares V(t) and I(t) and adds these two squared numbers to variables VSUM and ISUM as denoted by labels 1558 and 1559 respectively. The computer then increments the sample counter variable SAMPNUM 1551 by unity and compares the result with the number 120, (or some other number which denotes how many samples are to be averaged). If SAMPUM has not yet reached 120 samples, steps 1555 through 1561 are repeated until the 120 samples have been read and used to create sums PSUM, VSUM, and ISUM. Once SAMPUM has reached 120, the program now computes PAVE 1562 which is simply PSUM divided by the number of samples taken, (120, in this example). The program 1521 also computes VRMS 1563 and IRMS 1564 by respectively dividing variables VSUM and ISUM each by 120 and then computing the square root of each.

Finally, the microcomputer computes pf, (the power factor) 1565 by dividing PAVE by the product of VRMS and IRMS. This result is then output 1566 to the digital readout 1507.

The program then goes back to the start 1550 and repeats itself so that the user is provided with a continuously updated readout of the power factor, (pf).

As discussed above, the measurements of both voltage and current can be combined in one instrument. The two sensors, one for voltage and one for current act independently of each other. The electric field lines and the magnetic field lines are sensed independently by two different sensors as described above. Each of these parameters can be sensed, scaled, subjected to rectification, and then transmitted to a meter, a computer, a recording instrument or a control system.

Some specific instrument designs

The exact form of the measuring instrument can vary considerably. We have constructed some twenty different models for current measurements, some ten different models for voltage measurements, and some five different models for combined current, voltage, power and power factor measurements. Basically, the combination of the voltage and current measurement systems are physical combinations of the preceding contact-less current and voltage measurement systems previously discussed.

In FIG. 12, one of our systems for measuring voltage and current simultaneously (in cables) is shown. The specific design details are not critical; the important matter is to provide a consistent and deterministic placement for the sensors, (both current and voltage sensors), relative to the wires of the cable under measurement. In FIG. 12 the two or three conductor cable 10 is clamped into the capacitive sensor 12 which senses a voltage proportional to the voltage between the wires. The coil sensors 11 sense the magnetic fields of the wires and provide a voltage output proportional to the current flowing in the wires of the cable.

Within the body 13 of the instrument are the amplifiers and rms voltage converters. An internal spring causes a clamping action on the cable and the levers 14 enable gripper jaws 17 to be easily opened for the insertion of the cable. The jaws 17 open pivoted about the axle 16. The output of the instrument 15 can be selected to be proportional to either the voltage in the cable, the current flowing, the product of the voltage and the current, or the power factor (by calculating the cosine of the angle between the voltage wave and the current wave).

Voltage Matching Method

A further development of contact-less voltage measurements utilizes a matching of the incoming pickup voltage with a feedback voltage. The advantages of the voltage matching method are that wire centering is less critical and the measurement is very accurate. FIG. 13A shows the configuration of the voltage matching measurement for a single wire, and FIG. 14 shows the configuration of the voltage balance measurement for a two wire cable. In FIG. 13A the wire is labeled 1000. The sensing conductor is 1002 and the feed back conductor is 1001. By feeding back the voltage which is picked up, the feedback conductor 1001 is driven to a voltage nearly the same as that of the sensing conductor 1002 and thereby a nearly "infinite" input impedance is presented to the pickup sensor. This allows very good measurement accuracy, since the nearly infinite input impedance means that the voltage on the sensing conductor is virtually the same as the voltage in the wire, even if the coupling capacitance between the wire and sensing electrode is very low. If there is a need for larger feedback voltages than the amplifier 1003 is capable of producing, a transformer 1004 is utilized to step up the voltage, as shown in FIG. 13B.

In FIG. 14 a similar measurement system is utilized to measure the voltage in a two wire system. Here the two wires shown as a cable 1041 are surrounded by two sets of electrodes. The inner electrode plate 1040 senses the potential of the right hand wire. The sensor voltage is then transmitted to the op-amp 1051 which provides a feedback voltage 1054 which balances the sensed voltage. The feedback voltage is then also the output voltage which is directly proportional to the right hand wire in the cable 1041. For the left hand wire in the cable 1041 the sensor electrode is 1043 which provides a voltage to op-amp 1052. The op-amp provides a feedback voltage 1053 which just balances the sensed voltage and thereby provides an output voltage 1053 which is directly proportional to the left hand wire voltage. The voltage between 1054 and 1053 therefore provides a voltage output which is directly proportional to the voltage between the wires in the cable 1041. This thereby provides a contactless measurement of the voltage in the wires of the cable.

A further application of the voltage matching method is for very sensitive detection of signals. For example, the method may be applied to the detection of EKG and EEG signals to achieve contactless voltage pickup. In addition, the system may be applied to the pickup of telephone and data transmission signals where it is convenient to monitor the operation of a line without having to cut the line or expose the bare wires of the line.

To measure low level voltages such as EKG voltages, a set of two electrodes are placed on the body in the usual EKG locations. The electrodes are "layered" in two layers with insulation between the two electrodes. The inner electrode is the sensor electrode and the outer electrode is driven by the matching voltage just as in the wire matching system described above. Using this procedure, we have found that excellent EKG signals are obtained without the need to use a contact liquid or paste to provide a good electrical contact with the EKG subject. The advantage of this procedure for EKG sensing is that contact with the patient or subject is achieved without the usual "sticky" paste-on electrodes. The procedure can also be utilized for EEG electrodes, and other types of pickup sensors from animal and electronic systems where direct contact with the animal and electronic system is awkward, difficult, or impossible.

Current balance method

The configuration of a single wire and a two conductor cable current balance measurement is shown in FIGS. 15 and 16 respectively. In FIG. 15 coil 1151 senses the magnetic field of the wire 1150 and picks up a voltage. Amplifier 1152 amplifies the voltage picked up and converts the voltage into a current source which drives coil 1153 to generate a magnetic field in the opposite sense from the field produced by the current carrying wire 1150. The driven current is exactly the correct value to drive the input of the amplifier to a null input value. Therefore the output 1154 of the amplifier 1152 provides a voltage which is directly proportional to the current in wire 1150.

In FIG. 16 there are two wires 1220 which may be in a two conductor cable. A coil 1221 is a sensor for the magnetic field of the wire pair. The amplifier 1222 is driven by the sensor output 1225 and the output 1224 of the amplifier 1222 drives coil 1223 which is driven to the level necessary to cancel the sensor output 1225. The effect is to provide a very linear and accurate detector for the current in the wire pair. The output 1224 of the system provides a voltage directly proportional to the current carried by the wire pair 1220.

CONTACTLESS VOLTAGE MEASUREMENTS WITH AUTOMATIC COMPENSATION FOR WIRE OR SOURCE POSITION, SIZE, INSULATION, AND COUPLING FACTORS

While the above-described voltage measurement method is very accurate, it requires the generation of a matching voltage which must be of the same intensity of the voltage being measured. This makes the measurement of high voltages, such as power transmission lines awkward to do. For this reason it is often desirable to utilize a measurement method which uses internal voltages which are much smaller than the measured voltage. To do so, we can utilize a method which determines the coupling capacitances between the wire or source under measurement and the sensing electrode. This coupling capacitance varies because of the differences in insulation thicknesses for different kinds of cables, and also varies because insulation characteristics and thickness vary. Yet another source of capacitance variation is due to wire orientations and less-than-perfect fittings to position the wire relative to the sensor(s).

For those reasons, it is desirable to provide an automatic compensation for the different coupling capacitances.

The measurement of voltage in a source or a wire as described above in the voltage matching procedure is accurate and very useful for wires or sources which do not have very high voltages. However, for the larger voltages found in power lines or even in commercial and home wiring systems it is advantageous to provide a measurement system which operates at lower voltage levels. We next describe a system which automatically compensates for all of the characteristics of the wire or source and accurately measures the voltage of the wire or source without any direct contact. Consider the configuration of FIG. 17. The wire 1300 shown in cross section is surrounded or partially surrounded by two concentric electrodes, 1301 which is connected to wire 1303, and 1302 which is connected to wire 1304. These wires are capacitively coupled to the source voltage wire 1300 which has an unknown a.c. voltage Vw. A low pass filter or a band pass filter 1305 passes the frequency of the voltage Vw, but blocks other, (higher or lower), frequencies. The amplifier 1306 and the rms rectifier 1307 converts and scales the pickup voltage to d.c. and meter 1308 reads that voltage, (it is also possible to eliminate or change some of the signal conditioning elements here and to utilize an a.c. meter readout).

We next consider that the electronically activated switch 1309 connects wire 1303 with the voltage source 1310 which supplies a known voltage, Va which has a frequency Fa, which is significantly different in frequency from Fw, the frequency of the unknown voltage Vw. The known voltage is applied to the inner electrode 1301. The measurement of the output effect of the known voltage is accomplished by passing the voltage at Fw through a bandpass filter, (or high pass filter 1311, the amplifier 1312, and the rms rectifier 1313. The output voltage is then read out by meter 1314. (In actual practice, the same circuit is used by 1311, 1312, 1313, and 1314 as is used by 1305, 1306, 1307, and 1308. The only difference is in the frequency passed by the two different filters. Therefore, the same circuit would be used in practice by merely switching the frequency selective filters into and out of the circuit. In that way, the circuit is more economically attractive.)

It is also possible to utilize the same frequency for the measurement procedure by time sharing the feedback system using electronic switching to separate out the determination of the coupling parameter from the pickup voltage parameter.

We now have two different voltage output readings, one of Vw which is Vr, the readout voltage of meter 1308. The voltage Vr has an uncertainty relative to Vw because the coupling losses to the wire 1300 is not known, and a second voltage output reading Vb from meter 1314 of a known voltage Va at a frequency Fa. The second reading will be employed to determine the coupling constants and thereby provide a correction to Vr so that Vw will be accurately determined.

We next consider the equivalent circuits of the two output readings. These are shown in FIG. 18A and FIG. 18B. We consider FIG. 18A first. The equivalent voltage on the wire is represented by the voltage source 1400. The electrodes are equivalent to two capacitive couplings shown as capacitors 1401 and 1402. The voltage sampled at 1403 is essentially Vr. The value of Vr is given by:

$$Vr=Vw.Z1/(Z1+Z2)$$

where Z1 is the impedance of capacitor 1402 and Z2 is the impedance of capacitor 1401.

Next consider FIG. 18B. Here we have isolated the circuit as it applies to the known applied voltage Va with a very different frequency Fa. (By the use of discriminating filters it is easy to separate the two frequencies). Here the value of Va measured at 1411 is given by:

$$Vb=Va.Z1/(Z1+Z2)$$

where Z1 is the impedance of capacitor 1402 and Z2 is the impedance of capacitor 1401. Note that the impedances are different for the different frequencies but that the frequency term cancels because it is the same in the numerator and the denominator. It is also true that the variation of capacitance with a few thousand Hertz differences is very small. That is, the dielectric constants of standard types of insulating materials scarcely vary with moderate changes in frequency, (especially below a megahertz.)

Now we divide 6 by 7 and obtain:

$$Vr/Vb=Vw/Va \qquad 8$$

Since we have measured Vr and Vb and we have set Va at a fixed and known value, we can solve directly for Vw, which is the measurement we want, since $$Vw=Vr.Va/Vb \qquad 9$$

Therefore our measurement provides the true value of the voltage on the wire, (or the source to which we couple.)

In practice, however, the circuit design for the contactless voltage measurement will be more sophisticated. However the above description illustrates the principle of utilizing a known voltage source at a separate frequency to determine the coupling constant of one or more electrodes coupled to the wire or source and thereby determining the voltage on the wire or the source.

ALTERNATE METHOD FOR NONCONTACT VOLTAGE MEASUREMENT-THE COUPLING CAPACITANCE COMPENSATION TECHNIQUE

FIG. 19 illustrates apparatus for implementing the Coupling Capacitance Compensation technique. The major components are shown in the dotted line enclosure 916. The apparatus has the following elements: A sensing electrode 901 partially or completely surrounds the wire 900 whose voltage is to be measured. This creates a coupling capacitance 902, whose value Ccoup will vary depending on the exact wire position and geometry. This capacitance permits a current Icoup to flow into the wire 903. The value of Icoup is given by:

$$Icoup=Ccoup \; (dVwire/dt) \qquad 10$$

where Vwire is the voltage in the wire 900 being measured. The current Icoup is converted into a voltage proportional to the current Icoup by operational amplifier 904. The gain of amplifier 904 is established by resistor 905 with resistance value R. The voltage on the wire is Vwire given by Vp.sin (ωt) where Vp is the peak value of the (assumed a.c.) voltage, and where the angular frequency of the voltage, (often 2π60/sec), is given by ω. The time is given by t. The voltage V at the output of amplifier 904 is given by, then, (assuming 60 Hertz, for convenience), $$V=Ccoup \times Vp \times R \times 2 \times 3.14 \times 60 \times \cosine(2 \times 3.14 \times 60 \times t) \qquad 11$$

and its peak voltage simply has a value of Ccoup×R×2× 3.14×60 Vp. It can readily be seen that Ccoup is the only parameter which is unknown, and therefore we want to be able to determine its value in order to accurately measure the voltage Vp. The most accurate way to accommodate for Ccoup is to measure a known voltage in the wire, and then use Ccoup in future measurements, but it is not practical to put a known voltage into the wire being measured, since the major objective of this invention is the measurement of the voltage without contact with the wire or source. However, we can simulate the effect of having a known voltage on the wire, by putting a known voltage Vc on the input to the entire measurement instrument. This voltage will appear to the instrument as if it were flowing in the wire under test. The instrument can be continuously driven with this known voltage Vc, and will automatically and continuously adjust its gain, so that the instrument continually measures Vc at its correct and known value. In this invention Vc is generated by a conventional sine wave oscillator 906, which drives the outer electrode 907 as well as the non-inverting input of operational amplifier 904. The frequency of Vc should be chosen so as to be considerably higher than that of the frequency of the a.c. voltage in the wire. For measuring conventional 50/60 Hz a.c. voltages, Vc would typically have a frequency of 1000 to 10000 Hz and an amplitude of typically 1–5 volts. For this heuristic example, let's assume that Vc has an amplitude of 1 volt peak and a frequency of 6000 Hz. In this example, the voltage V at the output of operational amplifier 904 would be given by:

$$V = V(60) + V(6000) \qquad 12$$

where V(60) is the voltage due to Vwire (see above) and has a 60 Hz frequency, and V(6000) is the voltage due to the 6000 Hz signal which drives the instrument.

The value of V(6000) is simply given by $$V(6000) = 1 \times C_{coup} \times 2R \times 3.14 \times 6000 \times \cosine(2 \times 3.14 \times 6000 \times t) \qquad 13$$

and its peak value is simply equal to Ccoup×2R×3.14×6000. Therefore, if we make a measurement of V(6000) we can solve for Ccoup, and therefore be able to accurately insert this value for Ccoup in equation 9 above. Then, equation 13 could be readily solved for Vp, which is the peak value of voltage in the wire.

The necessary computation could be done using a microprocessor or analog computer of conventional design, it can also be done in a number of different ways. For example, if an analog multiplier 908, of conventional nature, is fed with the output of operational amplifier 904, it is now possible to vary the gain of the instrument and thereby automatically calibrate it for different values of Ccoup. This is done by using a conventional 6000 Hz bandpass filter, (a synchronous 6000 Hz lock-in detector may also be used), to separate the signal caused by the 6000 Hz driving signal from the unwanted 60 Hz signal on the wire being measured. This filtered signal is then fed into a conventional rectifier (or other detector, such as a conventional RMS-to-DC converter). The resulting d.c. voltage, which is proportional to the strength of the detected 6000 Hz signal, is then compared with an accurate reference voltage 911, such as a 1 volt d.c. source. This comparison is done using a conventional operational amplifier-based integrator 912, which integrates the difference between the detected signal voltage from 910 with the 1 volt reference. If the detected signal voltage is less than the I volt reference, the output 913 of the integrator increases in voltage, and when fed to multiplier 908, causes the gain of the instrument to increase, until the known 1 volt a.c. signal is truly measured as a 1 volt signal (as evidenced by a 1 volt d.c. detected signal). When this gain is thus set, the instrument will be automatically calibrated to give an accurate voltage when measuring a 60 Hz voltage in the wire. In fact, the 60 Hz signal is separated out from the 6000 Hz signal by a simple, conventional low-pass filter 914. The resulting output signal Vout 915 is an a.c. voltage which is directly proportional to Vwire. From equations 7 and 9 it can be readily seen that Vout is simply given by:

$$\begin{aligned} V_{out} &= (60Hz/6000Hz) \times V_{wire} \\ &= 0.01 \times V_{wire} \end{aligned}$$

It is possible to make the output voltage Vout 915 independent of input frequency, by setting the cutoff frequency of low-pass filter 914 so that it is much lower than the expected frequency of the a.c. voltage being measured. For example, if the a.c. signals being measured are in the 50 to 60 Hertz range, the filter 914 may be chosen to have a cutoff frequency of roughly 5 Hertz. If the filter 914 is a single pole filter, it will exhibit a frequency rolloff of 6 decibel per octave, which will precisely counteract the 6 decibel per octave increase in sensitivy with frequency due to equation 10. This 6 decibel increase in sensitivity is due to the fact that Ccoup, in conjunction with amplifier 904 and feedback resistor 905 form a differentiator circuit, which naturally has a 6 dB increase in output voltage with each octave of increasing input frequency. Fortunately, filter 914, when acting on signals far above its cutoff frequency, acts much like an integrator circuit which naturally has a 6 dB decrease in output voltage with each octave of increasing input frequency. Therefore, the net result of this integrator circuit/ differentiator circuit combination is a "flat" frequency response, which means that the sensitivity is unaffected by input frequency, at least over the range of frequencies above the cutoff frequency of filter 914.

The simplicity of expression 14 above is due to the fact that the system of measurement locks on to a standard one volt reference. It is also feasible to use a great many other approaches to the design of the measurement system. The key factor is the use of an independent signal generator to drive a coupling electrode. In addition, the signal generator is set at a significantly different frequency than the frequency of the voltage to be measured. The independent measurement of the effective output from the separate and known voltage source permits a determination of the coupling or the impedance of the coupling to the fundamental unknown voltage source. By knowing the coupling, one can readily compute the true voltage from the unknown source. There are many ways to carry out an analog or digital calculation for the determination of the relative coupling effects once the independent known voltage source is employed. The use of a different frequency for the independent source permits one to separate the known voltage measurement from the unknown voltage measurement.

The equivalent circuit of this measurement system is shown in FIG. 20A and FIG. 20B. FIG. 20A shows the equivalent circuit for the 60 Hertz measurement. Here 2100 is the equivalent voltage source for the wire or source under measurement. 2101 is the coupling capacitance (Ccoup) of the electrode to the source and 2102 is a short circuit to ground due to the virtual ground of the operational amplifier. 2103 is the voltage across the feedback resistor of the op-amp and the output 2104 is a voltage equal to the current flow at the frequency of the wire, (in this example, 60 Hz), times the resistance of the feedback resistor R. For the example described here, the magnitude of the voltage measured is equal to $2\pi R C_{coup} \times 60 \times V_p$.

In FIG. 20B the equivalent circuit for the measurement at 6,000 Hertz is shown. The coupling capacitor (Ccoup), is 2111. The standard voltage source provided at 6,000 Hertz is 2113. The current flow at 6,000 Hertz is through the conductor 2112. The equivalent circuit for the standard source, (Vstandard), which provides the voltage source is 2114, and the coupling capacitor, (Ccoup), is 2115. The circuit has a virtual ground 2116. We have thus shown that by driving the entire instrument with a 6000 Hz voltage with respect to ground, the instrument detects the same magnitude of 6000 Hz signal as if the wire had been driven at 6000 Hz with respect to the instrument. Since the magnitude of this 6000 Hz signal is known, we therefore have a way of directly measuring the coupling of an a.c. signal from the wire to the sensing electrode. This now-determined coupling coefficient is virtually identical to the coupling coefficient of the 60 HZ signal Vwire, which we are trying to measure. We thus have a way of compensating for any value of coupling coefficient we may encounter.

The equivalent circuits shown are for heuristic purposes. The specific frequencies chosen are examples, in practice, the frequencies may be considerably different than those used in these examples. The principle emphasized here is the use of a well determined voltage or current source to obtain the coupling measurement so that the coupling factor can be used as a correction term to accurately obtain the true voltage on the wire or source. There are of course many different circuits which can be designed to provide the correction term. A unique feature which this invention offers is that a "test voltage or current source" can be utilized to greatly improve the accuracy of a non-contacting voltage measurement.

This type of measurement system is readily applicable to measuring high voltages in power wiring, since a 60 Hz 120 Volt RMS voltage for Vwire will result in a 1.2 Volt RMS voltage for Vout. In this way, high a.c. voltages may be measured indirectly using circuitry which only employs very low voltages, which has a significant advantage for ease of operation and safety. For example, it is much easier to provide a battery operated system of measurement at lower voltages.

The above circuitry was designed to measure the voltage Vwire, with respect to a known ground (reference) point, such as that on the ground wire, or an earth ground in a building. To instead measure the voltage between two wires, the circuitry in FIG. 19 may be duplicated, as shown in FIG. 21. Here, it is desired to measure the voltage between two wires 917 and 918, each of which may have a different coupling capacitance between it and its corresponding sensing electrode 919 and 920, respectively. The signals from sensing electrodes 919 and 920 are fed to two identical circuits 925 and 926, which each contain circuitry substantially identical to that contained in 916 in FIG. 18. By using two a.c. voltage sources 923 and 924, and by using a conventional a.c. meter 927, it is practicable to measure the difference in voltage between wires 917 and 918. The two wires may be next to each other as in a cable or wire pair such as Romex, or they may be widely separated. The voltage between them, (that is, relative to each other), can be measured in either case.

VOLTAGE, CURRENT, POWER, AND POWER FACTOR MEASUREMENTS IN SINGLE WIRES

For single wires, the combination of one of the contactless voltage measurement system with a clamp-on current measurement system, such as those described above, or those in common use for single wire current measurements provides a very practicable means of measuring voltage and current together with a single clamp-on device. The power is obtained by simply multiplying the voltage readout and the current readout. The power factor is obtained by using a simple analog or digital integrated circuit to calculate the phase angle lead or lag. Because the signal processing is quite straightforward, either analog or digital signal processing, (microprocessors), can be utilized.

The above-described instrument is unique in that it is the first non-contact instrument which can measure all parameters of interest to electricians. Its greatly simplified "instant clamp-on" method of attachment makes new classes of products possible. For example, its capability of instantly and continuously measuring power factor make it applicable to being the controller for automatic power factor correction circuits suitable for small business and even home use.

USE OF THE SAME PRINCIPLE TO IMPROVE SINGLE WIRE CURRENT MEASUREMENTS

Conventional commercially available systems for a.c. current measurements of single wires utilize a split ferromagnetic core which is then clamped together over the single wire. The split magnetic core is a major source of inaccuracies in this measurement because there is an air gap and the faces of the split core cannot meet exactly. Using the concept of determining the effect of a local signal generator of well established known frequency and magnitude, a correction for the variations in the coupling of the core to the wire under measurement can be utilized to improve the accuracy of the measurement. The concept is described in FIG. 22a where the single wire 2200, (shown in cross section), which is under measurement carries an a.c. current which is to be measured. The wire is either insulated or bare, it doesn't matter since in either case the magnetic field of the wire couples to the surrounding split core 2201 which is shown slightly mis-aligned as often happens when the split core is brought together. In the conventional approach V(x) is the output voltage which is approximately directly proportional to the current in the wire 2200. In essence, the split core is a ferromagnetic, (or ferri-magnetic), coupling providing a reasonably efficient transformer between the wire 2200 and the coil 2202. The major source of inaccuracies in interpreting the value of V(x) is that the two cores 2201 frequently do not mate uniformly at their faces 2203.

The invention proposed here to improve the accuracy of the system is to provide a known signal source V(s) at a known frequency which is preferably at a different frequency than the wire 2200 under measurement. (Alternatively, the known signal source may be different in phase, such as 180 degrees out of phase with the phase of wire 2200). The known signal couples to the split core 2201 with one or many turns 2205. The coil 2206 picks up the signal V(s) coupled through the split core by virtue of the pickup coil 2206 which is wound on the other half of the split core. The signal from V(s) is at a sufficiently different frequency, (generally higher than the wire frequency), or at a different phase, so that it can be separated from the wire frequency by filter 2207. Lowpass filter 2209 is also required to remove the added signal due to V(s) from the voltage V(x). The output V(c) then provides a signal amplitude which is directly dependent upon the coupling between the two halves of the split core 2201. Using the amplitude of the signal V(k) at terminals 2208 to adjust the value of V(c) through multiplying or dividing, (either analog or digitally), one can easily correct for the inaccuracies of the split core, thereby greatly improving the measurement of the current in the single wire 2200. The signal generator 2204 should be very stable in amplitude and reasonably stable in frequency in order to provide very good accuracy to the measurement. Stability of the frequency can be accomplished by phase locking to the frequency of the wire either at the same frequency, (with the phase shifting approach), or at a multiple of the wire frequency in the higher frequency approach.

Another improvement of the clamp-on ammeter is schematically shown in FIG. 22b. The advantage of this circuit is that mis-alignments of the core are compensated and corrected automatically and also possible saturation of the core is circumvented. Here the current carrying wire 150 is again surrounded by a split ferromagnetic core 151 which may be mis-aligned 149. The voltage v(1) picked up by the transformer effect on the n turns 156 appears at the input 165 to the power op-amp 164. The output of op-amp 164 drives the coil 155 which can also have n turns, (or some other number of turns). Because the current is a.c., the power op-amp 164 dynamically drives coil 155 to a level which through the magnetic coupling to coil 156 brings the input of op-amp 164 to a virtual ground, thus exactly compensating for variations in the coupling of the split core and also causing the magnetization of the core to be virtually zero. The capacitor 158 and resistor 157 provides an a.c. ground but also provides a d.c. feedback path causing unity gain for the op-amp 165 at d.c. levels. The current sensing resistor 159 is utilized to provide an a.c. voltage output which is proportional to the current in the wire 150. That voltage is amplified and scaled to a convenient value by the op-amp 162. The gain of op-amp 162 is determined by the ratio of the resistance 160 to resistance 161. These resistances are set to a convenient scaling value. The voltage v(2) output at 163 is then directly proportional to the current 150 and can be rectified if desired to provide a d.c. voltage readout. The advantage of this circuit is that the clamp-on ammeter can now be utilized as a very accurate and reproducible measurement system.

MEASUREMENTS OF EKG, EEG, COMMUNICATION LINES AND OTHER LOW LEVEL VOLTAGES AND CURRENTS

All of the methods described above have applications to other measurements. For low level voltage pickup from a source such as the human body -EKG or EEG- sources, the electrodes are simply placed next to, or surrounding the desired voltage pickup area, and the voltage pickup level is practicable. A major advantage of the contactless voltage pickup for EKG and EEG electrodes is the avoidance of electrode conducting pastes on the subject. Another advantage is that the contacting electrodes are inexpensive and can either be re-used or discarded as desired.

Communication line pickup is also feasible with contactless electrodes. In the case of a wire pair, the magnetic field pickup approach such as that shown in FIG. 2A or 2B can be utilized, or alternatively, the contactless voltage pickup system described herein can be utilized. Both provide excellent sensitivity for signal detection.

Noncontact Measurement of D.C. Voltages

While most of the previously described apparatus is primarily for measuring a.c. voltages, with a modification, one can accurately measure d.c. voltages as well. Such a modified circuit is shown in FIG. 23.

To measure d.c. voltages on a continuous basis, it is useful to cause the sensing electrode 1102 to be constantly moved back and forth between the wire 1100 (whose voltage Vwire is to be measured) and a ground electrode 1101. This movement may be accomplished using a standard actuator 1103 which may be a solenoid, a linear motor, a rotary motor with an uneven cam, a voice coil actuator, or other conventional actuator capable of producing oscillatory motion. As the sensing electrode 1102 is thus moved upward along the direction of the electric field lines 1104 and closer to the wire, it moves into regions of increasing potential (voltage). This potential it sees reaches its peak when the sensing electrode 1102 finally touches the insulation 1100a of wire 1100. Later, as sensing electrode 1102 is moved downward, away from the wire, it then sees a decreasing potential, as it moves closer to ground electrode 1101. The above is due to the fact that the potential difference V between two points in a linear electric field E is given by $$V = E \cdot d \qquad 15$$

where d is the distance between the two points.

The voltage sensed by electrode 1102 is fed into an operational amplifier 1106, of conventional design, which boosts the available signal current so that an output voltage Vs is produced that is capable of driving the rms-to-D.C. converter integrated circuit 1107. The output of 1107 is fed into a d.c. meter, or alternately an analog-to-digital converter, of conventional design. Resistor 1105 is a very high impedance resistor, typically 100 megohms or more, which is required, in practice, to prevent the operational amplifier 1106 from saturating.

The amplified voltage at the output of amplifier 1106 is displayed in FIG. 24, which is a graph of voltage versus time. At time=0, the solenoid 1103 is not driven, and the sensing electrode is resting on or near ground electrode 1101 of FIG. 23 and thus sensing electrode 1102 detects a voltage of zero volts. Then, at time tu1 the solenoid 1103 is energized and pushes the sensing electrode 1102 upwards until it hits the insulation of the wire whose voltage is to be measured. This results in the electrode now encountering a region in which the potential 1111 is given by K×Vwire, which is a voltage proportional to the voltage of the wire 1100, but somewhat less, due to the fact that there is a voltage drop across the insulation 1100a of the wire. This voltage 1111 will begin to decline, and if the sensing electrode were not to be moved, would eventually go toward zero volts, as shown by dotted line 1115. This is due to leakage of the charge in sensing electrode 1102 due to resistor 1105 as well as charge leakage in amplifier 1106. However, long before the voltage declines appreciably, the solenoid is de-energized, causing the sensing electrode 1102 to spring back to the ground electrode 1102 at time td1 (1112 on the Figure). At this point, the electrode again sees a potential of zero volts, as shown by the waveform dropping to zero at time td1. The time between tu1 and td1 may range from approximately 1 millisecond to several seconds, but would typically be approximately 50 milliseconds.

The above process is repeated, resulting in the waveform of FIG. 24, which has a peak-to-peak value of K×Vwire, which is directly proportional to the d.c. voltage on the wire. By either rectifying this voltage, or feeding it into an rms-to-d.c. converter 1107, a d.c. voltage would be produced which is again proportional to the d.c. voltage on the wire. It should be noted that it is not necessary to move the sensing electrode 1102 so far upwards that it actually touches the insulation 1100a of the wire, nor is it necessary to move 1102 so far downward that it actually touches the ground electrode 1101, since any degree of motion along the direction of the field lines 1104 will result in the detection of a time-varying voltage whose peak-to-peak intensity is directly proportional to the d.c. voltage Vwire. However, accuracy is greatly enhanced by moving sensing electrode 1102 so that it actually alternately contacts wire insulation 1100a and ground electrode 1101, since these two points provide accurate fiducial references. Ground electrode 1101 provides a true zero-volt potential. By contacting wire insulation 1102, the sensing electrode is assured of receiving the highest possible signal level, which is nearly independent of actual wire position. For example, if the wire is inadvertently mis-positioned so that it is further from the ground electrode, the electric field lines 1104 will be less closely spaced, and the electric field will be weaker. However, if the solenoid moves sensing electrode 1102 the extra distance necessary to contact the insulation 1100a of the further-away wire 1100, the voltage sensed by 1102 will still have nearly the same peak-to-peak intensity, since the electrode travel distance is now greater. In a similar manner, if the wire 1100 is located closer than optimal to ground electrode 1101, the electrode travel distance will be less than normal. However, since the field strength will be greater (field lines 1104 will be closer together), the peak-to-peak voltage sensed by 1102 will still be roughly the same as if the wire had been ideally positioned. This is true, since V=E×d (see above), and if d is reduced, E will increase for the same voltage Vwire. Therefore Vs will remain roughly proportional to Vwire, if the sensing electrode travel distance is kept roughly the same as d. A mechanically elegant and simple way to do this than to merely set the sensing electrode 1102 so that it simply oscillates back and forth between the wire insulation 1100*a* and the ground electrode 1101.

In addition to accurately measuring voltages in wires, the voltage measurement methods described above may be used to measure electric fields more sensitively and more accurately in other diverse applications. For example, by sensing the electric fields from power lines at some distance from these lines, the sensor system could be used to warn helicopter pilots, and other plane pilots of the collision danger and in that way help to prevent aircraft collisions with power lines. In addition, by sensing the position of a small aircraft relative to specific power lines, the system may be utilized to aid aircraft in poor visibility situations.

The present invention has been described with reference to a few specific embodiments, The description herein is illustrative of the invention and is not to be construed as limiting the invention. Various modifications may occur to those skilled in the art without departing from the true spirit and scope of the invention as defined by the appended claims.

What is claimed is:

1. A non-contacting system for measuring the AC voltage of a first frequency on conductive element comprising:

sensor means for generating a first signal in response to the AC voltage of said conductive element, said sensor means including a conductive sensing electrode positioned so as to be spaced from and at least partially circumscribe said conductive element wherein said conductive sensing electrode is electrically coupled to said conductive element solely through a coupling capacitance therebetween;

a calibration source for providing a calibration AC voltage at a locally determined frequency, said sensor means including means responsive to said calibration AC voltage for impressing a calibration voltage between said conductive sensing electrode and said conductive element;

whereby a calibration response signal at said locally determined frequency is produced by said sensor means as a consequence of said impression of said calibration voltage, said calibration response signal being a function of said coupling capacitance; and calibration network means, operatively coupled to said sensor means, for adjusting said first signal by a gain factor determined in accordance with said calibration response signal in order to generate an output signal indicative of said AC voltage of said conductive element; said output signal being substantially independent of said coupling capacitance between said conductive element and said conductive sensing electrode.

2. The non-contacting system of claim 1 wherein said sensor means includes a conductive shield positioned so as to at least partially circumscribe said conductive sensing electrode and said conductive element.

3. The non-contacting system of claim 2 wherein said impressing means includes an operational amplifier having a first input connected to said conductive shield and to said calibration source, a second input connected to said conductive sensing element, and an output.

4. The non-contacting system of claim 3 wherein said calibration network means further includes a multiplier circuit connected to the output of the sensor means and integrator means for adjusting gain of said multiplier circuit in response to magnitude of said calibration response signal.

5. The non-contacting system of claim 4 wherein said calibration network means includes a bandpass filter, operatively connected to said multiplier circuit, for providing said calibration response signal by selectively passing to said integrator means output signals produced by said multiplier circuit included within a passband encompassing predetermined frequency.

6. The non-contacting system of claim 4 further including a lowpass filter, operatively connected to said multiplier circuit, for producing an output voltage proportional to said voltage in said conductive element, said filter comprising a single pole low-pass filter with a roll-off of approximately 6 decibels per octave in said filter's stopband region and a cutoff frequency lower than said predetermined frequency.

7. A non-contacting system for measuring voltage of a conductive element comprising:

an inner sensing electrode located in an electric field of said conductive element, said inner sensing electrode being out of direct electrical contact with said conductive element but being solely electrically capacitively coupled to said conductive element through coupling capacitance therebetween;

an outer shield positioned so as to at least partially circumscribe said conductive element and said inner sensing electrode;

amplifier means, having an input connected to said inner sensing electrode and an output disposed to apply a feedback signal to said inner sensing electrode;

means for providing a second signal to said outer shield and to said amplifier means, said amplifier means providing said second signal to said inner sensing electrode;

wherein application of said feedback signal to said inner sensing electrode results in a voltage at an output terminal of said amplifier means which is directly proportional to the magnitude of said coupling capacitance, and which therefore can be used by a calibration network to provide an ultimate output signal which is independent of said coupling capacitance.

8. The non-contacting system of claim 7 wherein said amplifier means comprises an operational amplifier wherein said operational amplifier includes an inverting terminal connected to said inner sensor, and wherein non-inverting and output terminals of said operational amplifier are connected to said outer shield.

\* \* \* \* \*